United States Patent
Fang et al.

(10) Patent No.: US 11,869,833 B2
(45) Date of Patent: Jan. 9, 2024

(54) PACKAGE COMPRISING A SUBSTRATE WITH A VIA INTERCONNECT COUPLED TO A TRACE INTERCONNECT AND METHOD OF FABRICATING THE SAME

(71) Applicant: QUALCOMM Incorporated, San Diego, CA (US)

(72) Inventors: Kun Fang, San Diego, CA (US); Jaehyun Yeon, San Diego, CA (US); Suhyung Hwang, Rancho Mission Viejo, CA (US); Hyunchul Cho, Suwon (KR)

(73) Assignee: QUALCOMM INCORPORATED, San Diego, CA (US)

( * ) Notice: Subject to any disclaimer, the term of this patent is extended or adjusted under 35 U.S.C. 154(b) by 261 days.

(21) Appl. No.: 17/476,383

(22) Filed: Sep. 15, 2021

(65) Prior Publication Data
US 2023/0078231 A1  Mar. 16, 2023

(51) Int. Cl.
*H01L 23/498* (2006.01)
*H01L 21/48* (2006.01)
*H01L 23/31* (2006.01)
*H01L 23/00* (2006.01)

(52) U.S. Cl.
CPC .... *H01L 23/49822* (2013.01); *H01L 21/4857* (2013.01); *H01L 23/49838* (2013.01); *H01L 23/3128* (2013.01); *H01L 24/16* (2013.01); *H01L 2224/16227* (2013.01)

(58) Field of Classification Search
CPC ........... H01L 23/49822; H01L 21/4857; H01L 23/49838
See application file for complete search history.

(56) References Cited

U.S. PATENT DOCUMENTS

| | | |
|---|---|---|
| 8,324,699 B2 | 12/2012 | Ichijo et al. |
| 2008/0225501 A1 | 9/2008 | Cho et al. |
| 2009/0283303 A1 | 11/2009 | Chang et al. |
| 2014/0117380 A1 | 5/2014 | Loboda et al. |
| 2014/0131073 A1 | 5/2014 | Itabashi |
| 2014/0306250 A1 | 10/2014 | Gardner et al. |
| 2015/0255416 A1* | 9/2015 | Kim ........................ H01L 24/24 438/126 |
| 2016/0056094 A1* | 2/2016 | Muniandy ........... H01L 21/4846 438/122 |
| 2017/0231093 A1* | 8/2017 | Ho ........................ H05K 3/4038 |
| 2017/0271501 A1 | 9/2017 | Avci et al. |
| 2018/0005846 A1 | 1/2018 | Tsai et al. |
| 2018/0083435 A1 | 3/2018 | Redler |
| 2019/0348354 A1 | 11/2019 | Ho et al. |
| 2020/0111758 A1* | 4/2020 | Patil ...................... H01L 23/552 |
| 2020/0144191 A1* | 5/2020 | Lee ..................... H01L 21/6835 |

OTHER PUBLICATIONS

International Search Report and Written Opinion—PCT/US2022/040354—ISA/EPO—dated Dec. 19, 2022.

* cited by examiner

*Primary Examiner* — Michael Jung
(74) *Attorney, Agent, or Firm* — Loza & Loza, LLP

(57) ABSTRACT

A package that includes a substrate and an integrated device coupled to the substrate. The substrate includes at least one dielectric layer and a plurality of interconnects comprising a first via interconnect and a first trace interconnect, wherein the first via interconnect is directly coupled to the first trace interconnect. The first via interconnect is coupled to the first trace interconnect without an intervening pad interconnect between the first via interconnect and the first trace interconnect.

14 Claims, 18 Drawing Sheets

CROSS SECTIONAL PROFILE VIEW

CROSS SECTIONAL PROFILE VIEW

CROSS SECTIONAL PROFILE VIEW

CROSS SECTIONAL PROFILE VIEW

PLAN VIEW

PLAN VIEW

PLAN VIEW

PACKAGE COMPRISING A SUBSTRATE WITH A VIA INTERCONNECT COUPLED TO A TRACE INTERCONNECT AND METHOD OF FABRICATING THE SAME

FIELD

Various features relate to packages with a substrate.

BACKGROUND

A package may include a substrate and integrated devices. These components are coupled together to provide a package that may perform various electrical functions. There is an ongoing need to provide better performing packages and reduce the overall size of packages.

SUMMARY

Various features relate to packages with a substrate.

One example provides a package that includes a substrate and an integrated device coupled to the substrate. The substrate includes at least one dielectric layer and a plurality of interconnects comprising a first via interconnect and a first trace interconnect. The first via interconnect is directly coupled to the first trace interconnect.

Another example provides an apparatus that includes a substrate. The substrate includes at least one dielectric layer and a plurality of interconnects comprising a first via interconnect and a first trace interconnect. The first via interconnect is directly coupled to the first trace interconnect.

Another example provides a method for fabricating a substrate. The method provides at least one dielectric layer. The method forms a plurality of interconnects comprising a first via interconnect and a first trace interconnect. The first via interconnect is formed such that the first via interconnect is directly coupled to the first trace interconnect.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device coupled to the substrate. The substrate includes at least one dielectric layer and a plurality of interconnects comprising a first via interconnect and a first trace interconnect. The first via interconnect is directly coupled to the first trace interconnect. The first via interconnect is coupled to the first trace interconnect without an intervening pad interconnect between the first via interconnect and the first trace interconnect. Coupling a via interconnect directly to a trace interconnect helps increase the number of trace interconnects in the substrate, which helps increase the interconnect routing density of the substrate, while also helping reduce the overall footprint and size of the substrate and/or the package. High density routing may help improve the performance of the integrated device and/or the package.

Figure 1:
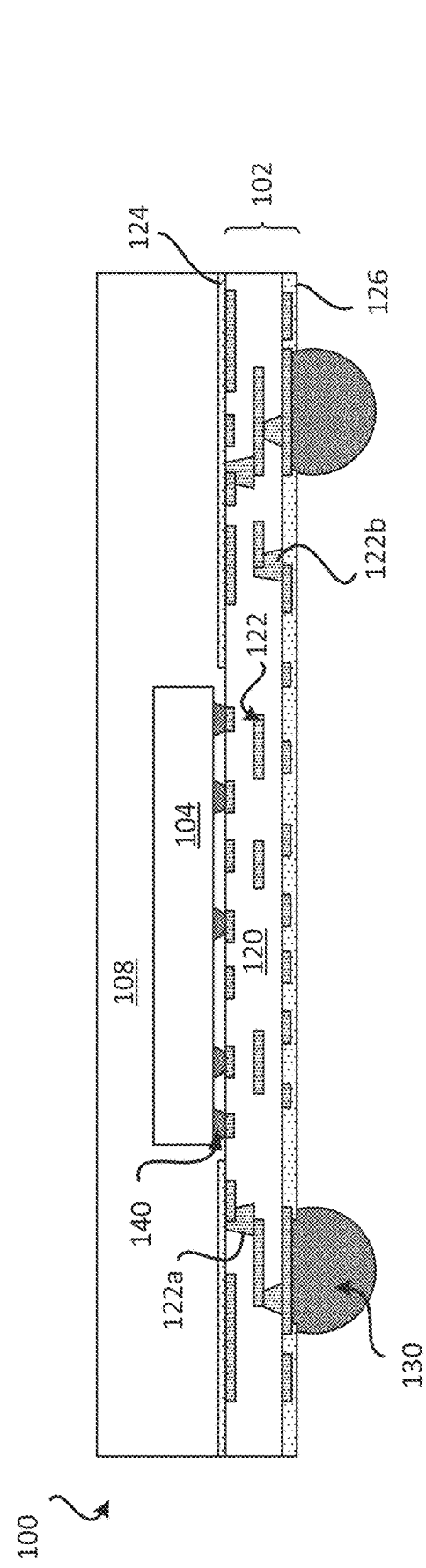
FIG. 1 illustrates an exemplary cross sectional profile view of a package that includes a substrate with a via interconnect having direct coupling to a trace interconnect.

Exemplary Package Comprising a Substrate with a Via Interconnect Coupling to a Trace Interconnect FIG. 1 illustrates a cross sectional profile view of a package 100 that includes a substrate with direct via interconnect coupling to trace interconnect. The package 100 includes a substrate 102, an integrated device 104 and an encapsulation layer 108.

The substrate 102 includes at least one dielectric layer 120, a plurality of interconnects 122, a solder resist layer 124, and a solder resist layer 126. The substrate 102 may be a coreless substrate (e.g., embedded trace substrate (ETS)). The substrate 102 may include a first surface (e.g., top surface) and a second surface (e.g., bottom surface). The solder resist layer 124 may be located on the first surface of the substrate 102. The solder resist layer 126 may be located on the second surface of the substrate 102. The plurality of interconnects 122 includes a via interconnect 122a and a via interconnect 122b. As will be further described below, a via interconnect (e.g., 122a, 122b) may be directly coupled to one or more trace interconnects, bypassing the need for an intervening pad interconnect between a via interconnect and a trace interconnect. Such direct coupling of via interconnects and trace interconnects may be located in an escape portion of the substrate 102, where routing density is very high, and pad interconnects would take up a lot of space that could be used for other interconnects.

A plurality of solder interconnects 130 is coupled to the plurality of interconnects 122 of the substrate 102. The integrated device 104 is coupled to a first surface (e.g., top surface) of the substrate 102 through a plurality of solder interconnects 140. For example, the integrated device 104 is coupled to the plurality of interconnects 122 of the substrate 102 through the plurality of solder interconnects 140.

The encapsulation layer 108 is provided (e.g., formed) over the first surface of the substrate 102. The encapsulation layer 108 may encapsulate the integrated device 104. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Figure 2:
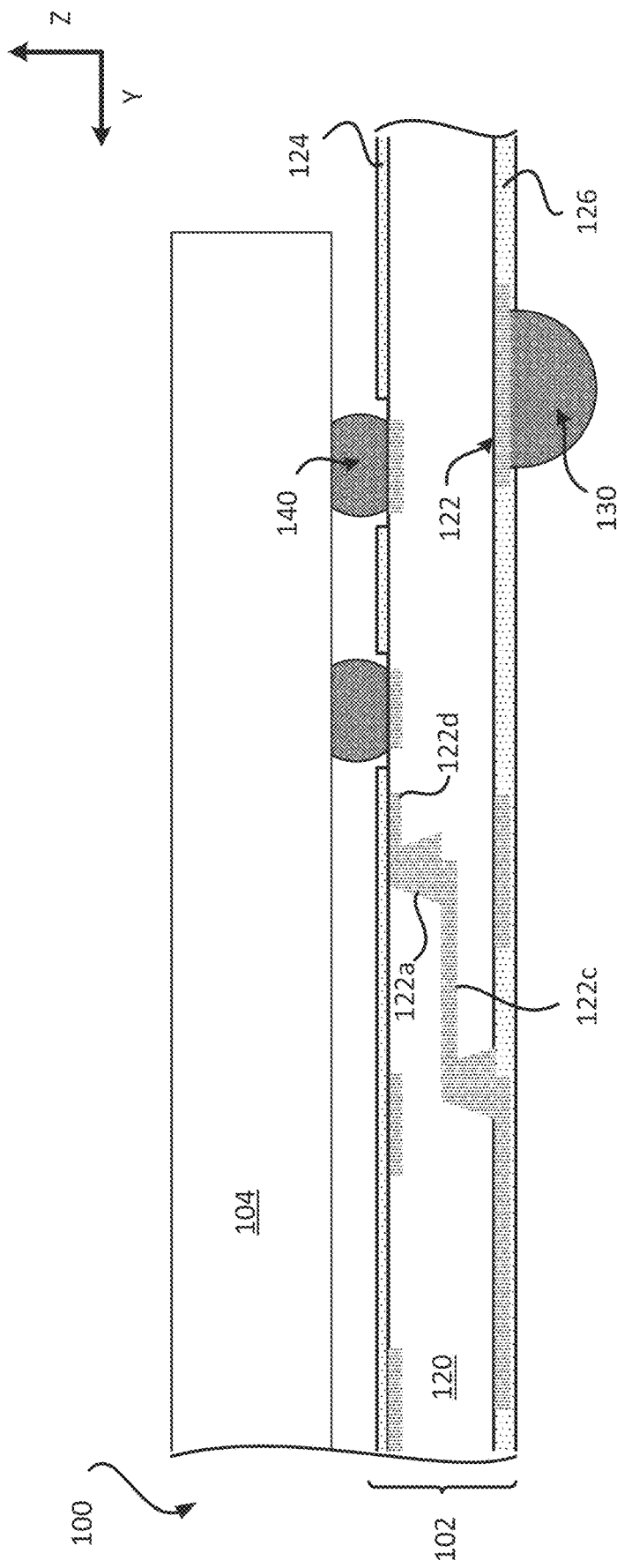
FIG. 2 illustrates an exemplary close-up view of a package that includes a substrate with a via interconnect having direct coupling to a trace interconnect.

FIG. 2 illustrates an exemplary close-up view of the package 100 of FIG. 1. As shown in FIG. 2, the integrated device 104 is coupled to the substrate 102 through the plurality of solder interconnects 140. The substrate 102 includes the at least one dielectric layer 120 and the plurality of interconnects 122. The plurality of interconnects 122 includes the via interconnect 122a, a trace interconnect 122c and a trace interconnect 122d. The trace interconnect 122c is directly coupled to the via interconnect 122a. In this example, the trace interconnect 122c is coupled to a surface (e.g., bottom surface) of the via interconnect 122a without an intervening pad interconnect between the via interconnect 122a and the trace interconnect 122c. The trace interconnect 122d is directly coupled to the via interconnect 122a. In this example, the trace interconnect 122d is coupled to a side portion (e.g., side surface) of the via interconnect 122a without an intervening pad interconnect between the via interconnect 122a and the trace interconnect 122d. In some implementations, the trace interconnect 122d may be considered embedded in the via interconnect 122a.

Different implementations may use different substrates with via interconnects having direct coupling to trace interconnects, and vice versa. For example, some implementations may use a cored substrate that includes via interconnects having direct coupling to trace interconnects, and vice versa.

Figure 3:
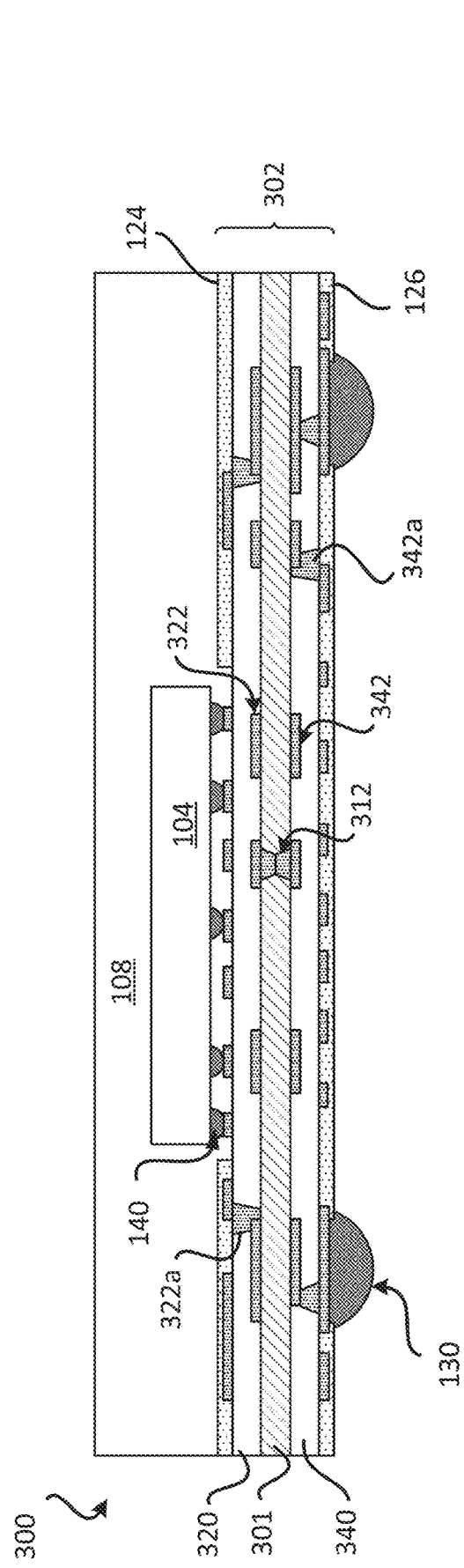
FIG. 3 illustrates an exemplary cross sectional profile view of a package that includes a substrate with a via interconnect having direct coupling to a trace interconnect.

FIG. 3 illustrates a cross sectional profile view of a package 300 that includes a cored substrate with direct via interconnect coupling to trace interconnect. The package 300 includes a substrate 302, the integrated device 104 and the encapsulation layer 108.

The substrate 302 may be a cored substrate. The substrate 302 includes a core layer 301, at least one dielectric layer 320, at least one dielectric layer 340, a plurality of core interconnects 312, a plurality of interconnects 322, a plurality of interconnects 342, a solder resist layer 124, and a solder resist layer 126. The substrate 302 may include a first surface (e.g., top surface) and a second surface (e.g., bottom surface). The solder resist layer 124 may be located on the first surface of the substrate 302. The solder resist layer 126 may be located on the second surface of the substrate 302. The plurality of interconnects 322 includes a via interconnect 322a. The plurality of interconnects 342 includes a via interconnect 342a. As will be further described below, a via interconnect (e.g., 322a, 342a) may be directly coupled to one or more trace interconnects, bypassing the need for an intervening pad interconnect between a via interconnect and a trace interconnect.

A plurality of solder interconnects 130 is coupled to the plurality of interconnects 342 of the substrate 302. The integrated device 104 is coupled to a first surface (e.g., top surface) of the substrate 302 through a plurality of solder interconnects 140. For example, the integrated device 104 is coupled to the plurality of interconnects 322 of the substrate 302 through the plurality of solder interconnects 140.

The encapsulation layer 108 is provided (e.g., formed) over the first surface of the substrate 302. The encapsulation layer 108 may encapsulate the integrated device 104. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Figure 4:
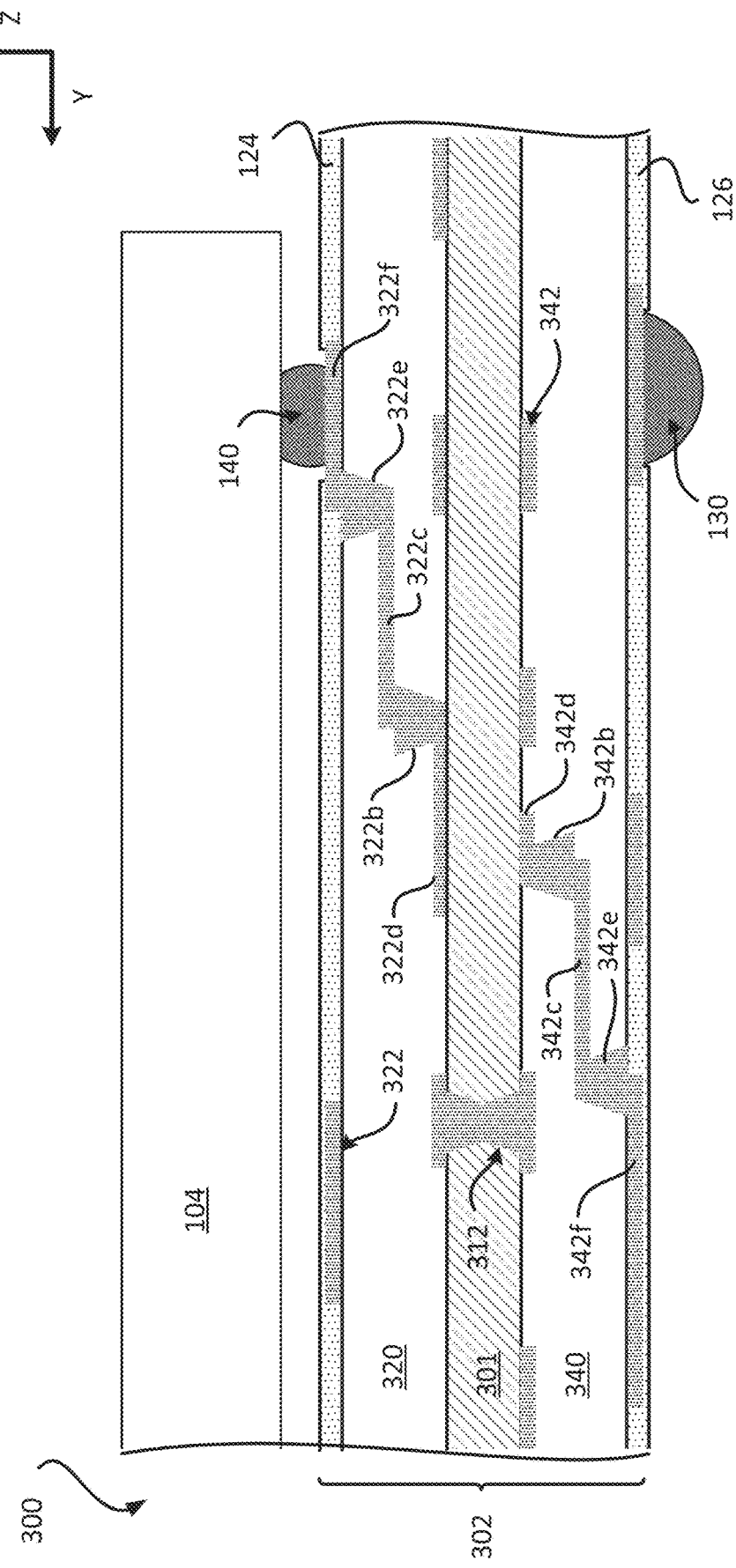
FIG. 4 illustrates an exemplary close-up view of a package that includes a substrate with a via interconnect having direct coupling to a trace interconnect.

FIG. 4 illustrates an exemplary close-up view of the package 300 of FIG. 3. As shown in FIG. 4, the integrated device 104 is coupled to the substrate 302 through the plurality of solder interconnects 140. The substrate 302 includes the core layer 301, the at least one dielectric layer 320, the at least one dielectric layer 340, the plurality of core interconnects 312, the plurality of interconnects 322, and the plurality of interconnects 342. The plurality of interconnects 322 includes the via interconnect 322b, a trace interconnect 322c, a trace interconnect 322d, a via interconnect 322e, and a trace interconnect 322f.

The trace interconnect 322c is directly coupled to the via interconnect 322b. In this example, the trace interconnect 322c is coupled to a surface (e.g., first surface, top surface) of the via interconnect 322b without an intervening pad interconnect between the via interconnect 322b and the trace interconnect 322c. The trace interconnect 322d is directly coupled to the via interconnect 322b. In this example, the trace interconnect 322d is coupled to a side portion (e.g., side surface) of the via interconnect 322b without an intervening pad interconnect between the via interconnect 322b and the trace interconnect 322d. In some implementations, the trace interconnect 322d may be considered embedded in the via interconnect 322b.

The trace interconnect 322f is directly coupled to the via interconnect 322e. In this example, the trace interconnect 322f is coupled to a surface (e.g., first surface, top surface) of the via interconnect 322e without an intervening pad interconnect between the via interconnect 322e and the trace interconnect 322f. The trace interconnect 322c is directly coupled to the via interconnect 322e. In this example, the trace interconnect 322c is coupled to a side portion (e.g., side surface) of the via interconnect 322e without an intervening pad interconnect between the via interconnect 322e and the trace interconnect 322c. In some implementations, the trace interconnect 322c may be considered embedded in the via interconnect 322e.

The trace interconnect 342c is directly coupled to the via interconnect 342b. In this example, the trace interconnect 342c is coupled to a surface (e.g., first surface, bottom surface) of the via interconnect 342b without an intervening pad interconnect between the via interconnect 342b and the trace interconnect 342c. The trace interconnect 342d is directly coupled to the via interconnect 342b. In this example, the trace interconnect 342d is coupled to a side portion (e.g., side surface) of the via interconnect 342b without an intervening pad interconnect between the via interconnect 342b and the trace interconnect 342d. In some implementations, the trace interconnect 342d may be considered embedded in the via interconnect 342b.

The trace interconnect 342f is directly coupled to the via interconnect 342e. In this example, the trace interconnect 342f is coupled to a surface (e.g., first surface, bottom surface) of the via interconnect 342e without an intervening pad interconnect between the via interconnect 342e and the trace interconnect 342f. The trace interconnect 342c is directly coupled to the via interconnect 342e. In this example, the trace interconnect 342c is coupled to a side portion (e.g., side surface) of the via interconnect 342e without an intervening pad interconnect between the via interconnect 342e and the trace interconnect 342c. In some implementations, the trace interconnect 342c may be considered embedded in the via interconnect 342e.

It is noted that for the substrate 102 and/or the substrate 302, some of trace interconnects may be coupled to via interconnects through a pad interconnect.

Figure 5:
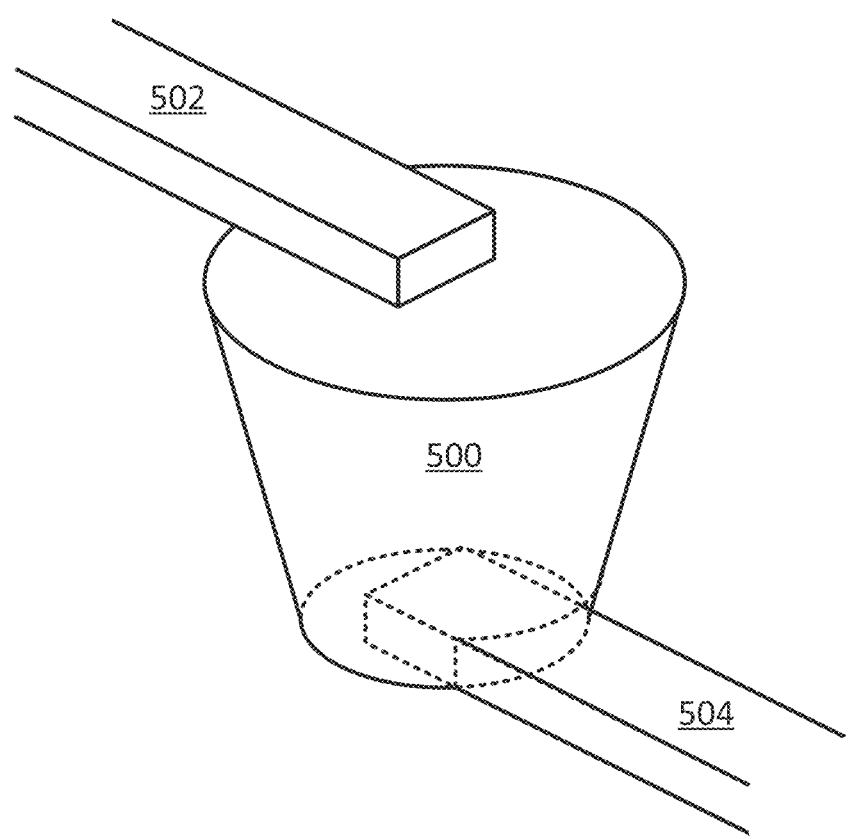
FIG. 5 illustrates an exemplary view of a via interconnect having direct coupling to a trace interconnect.

FIG. 5 illustrates an exemplary view of direct via interconnect coupling to trace interconnects. FIG. 5 illustrates a via interconnect 500, a trace interconnect 502 and a trace interconnect 504. The via interconnect 500 may represent any of the via interconnects described in the disclosure. The trace interconnect 502 and/or the trace interconnect 504 may represent any of the trace interconnects described in the disclosure. The trace interconnect 502 is directly coupled to a surface (e.g., first surface, top surface, bottom surface) of the via interconnect 500. The trace interconnect 504 is directly coupled to a side portion (e.g., side surface) of the via interconnect 500.

The via interconnect 500 includes a via width (e.g., via diameter, first width). The trace interconnect 502 includes a trace width (e.g., second width, third width). The trace interconnect 502 includes a trace width (e.g., second width, third width). As shown in FIG. 5, the trace width of the trace interconnect 502 and/or the trace width of the trace interconnect 504 is less than the via width of the via interconnect 500. The via width of the interconnect 500 is greater than the trace width of the trace interconnect 502 and/or the trace width of the trace interconnect 504. A pad interconnect is typically defined as an interconnect on a metal layer (e.g., M1, M2, . . . ) having a width and/or a diameter that is greater than (i) the width of a trace interconnect and (ii) the width and/or a diameter of a via interconnect. FIG. 5 illustrates a more detailed example of how direct coupling of a via interconnect to a trace interconnect may bypass a pad interconnect between the via interconnect and the trace interconnect.

In some implementations, the trace interconnect 504 may be considered embedded in the via interconnect 500. In some implementations, the portion of the trace interconnect 504 that is embedded in the via interconnect 500 may be indistinguishable from the via interconnect 500. In some implementations, there may be an interface between the trace interconnect 504 and the via interconnect 500. In some implementations, the trace interconnect 502 may be a first trace interconnect, and the trace interconnect 504 may be a second trace interconnect. In some implementations, the trace interconnect 504 may be a first trace interconnect, and the trace interconnect 502 may be a second trace interconnect.

Figure 6:
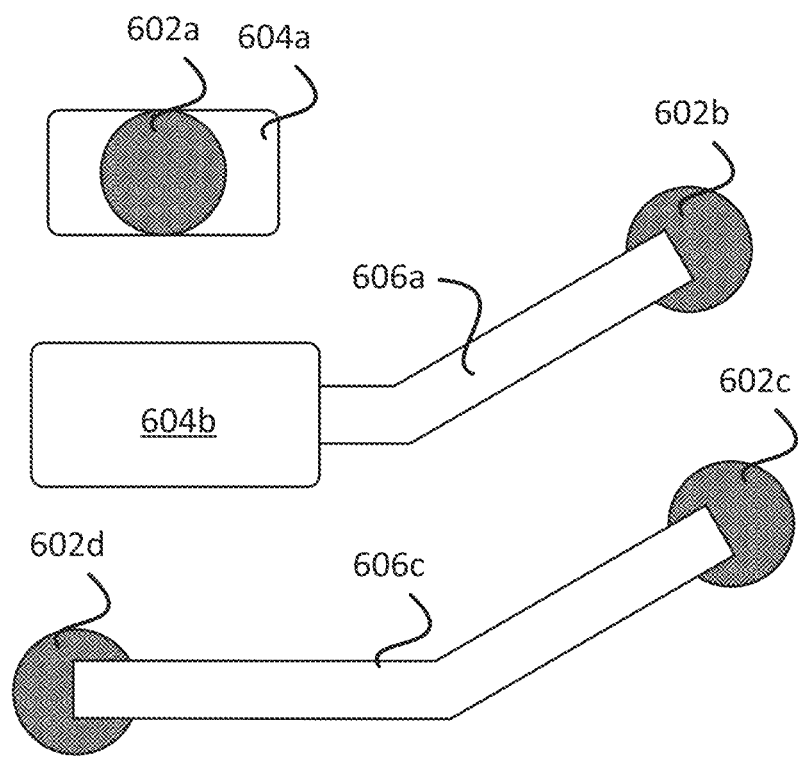
FIG. 6 illustrates an exemplary planar view via interconnects having direct coupling to trace interconnects.

FIG. 6 illustrates a plan view of exemplary configurations of interconnects in a substrate. FIG. 6 illustrates a via interconnect 602a, a via interconnect 602b, a via interconnect 602c, a via interconnect 602d, a pad interconnect 604a, a pad interconnect 604b, a trace interconnect 606a, and a trace interconnect 606b. In some implementations, at least a portion of the via interconnects (e.g., 602a, 602b, 602c, 602d) may be located on a same metal layer as the pad interconnects (e.g., 604a, 604b). In some implementations, at least a portion of the via interconnects (e.g., 602a, 602b, 602c, 602d) may be located on a same metal layer as the trace interconnects (e.g., 606a, 606b). In some implementations, the trace interconnects (e.g., 606a, 606b) may be embedded through a side portion of the via interconnects (e.g., 602b, 602c, 602d) In some implementations, the trace interconnects (e.g., 606a, 606b) may be located over and coupled to a portion (e.g., top portion, bottom portion) of the via interconnects (e.g., 602b, 602c, 602d)

The via interconnect 602a is directly coupled to the pad interconnect 604a. The via width (e.g., via diameter) of the via interconnect 602a may be approximately the same as the pad width of the pad interconnect 604a. However, the via width (e.g., via diameter) of the via interconnect 602a may be less than the pad width of the pad interconnect 604a along a different direction. The trace interconnect 606a is directly coupled to the via interconnect 602b. The trace interconnect 606a is directly coupled to the pad interconnect 604b. The trace interconnect 606b is directly coupled to the via interconnect 602c. The trace interconnect 606a is directly coupled to the via interconnect 602d.

Figure 7:
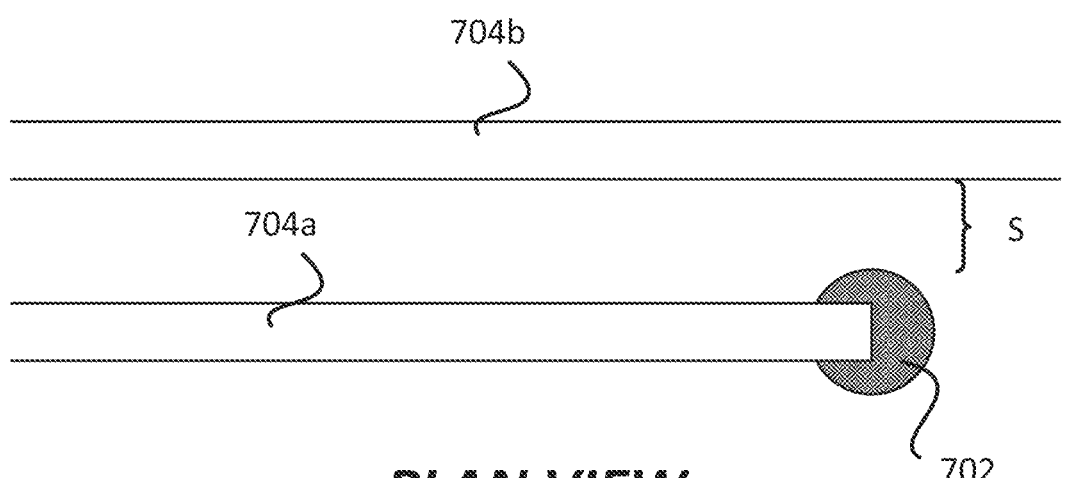
FIG. 7 illustrates an exemplary planar view of a via interconnect having direct coupling to a trace interconnect.

FIG. 7 illustrates an exemplary plan of a configuration of interconnects in a substrate. FIG. 7 illustrates a via interconnect 702, a trace interconnect 704a and a trace interconnect 704b. The via interconnect 702 is directly coupled to the trace interconnect 704a. The trace interconnect 704b is adjacent to the trace interconnect 704a. The trace interconnect 704a may be on the same metal layer as the trace interconnect 704b. A portion of the via interconnect 702 may be located on the same metal layer as the trace interconnect 704a and the trace interconnect 704b. In some implementations, the trace interconnect 704a may be located over a portion of the via interconnect 702. At least a portion of the trace interconnect 704b is parallel to at least a portion of the trace interconnect 704a, and vice versa. The use of direct coupling between a via interconnect and a trace interconnect, thus bypassing a pad interconnect between the via interconnect and the trace interconnect, allows adjacent trace interconnects to be closer to each other. Pad interconnects normally have a greater width than trace interconnects and via interconnects, thus requiring more spacing between adjacent trace interconnects. However, with the elimination of the pad interconnects, the limiting factor to how close trace interconnects can be to each other is the size (e.g., width, diameter) of the via interconnects. The size of a via interconnect may be smaller than the size of pad interconnects, but greater than the size of trace interconnects. In some implementations, a minimum spacing (S) between the trace interconnect 704b and the via interconnect 702 may be about 25 micrometers. In some implementations, a spacing (S) between the trace interconnect 704b and the via interconnect 702 may be less than 45 micrometers. In some implementations, a spacing (S) between the trace interconnect 704b and the via interconnect 702 may be in a range of about 25-45 micrometers. In some implementations, the trace interconnect 704a may be a first trace interconnect, and the trace interconnect 704b may be a second trace interconnect.

Figure 8:
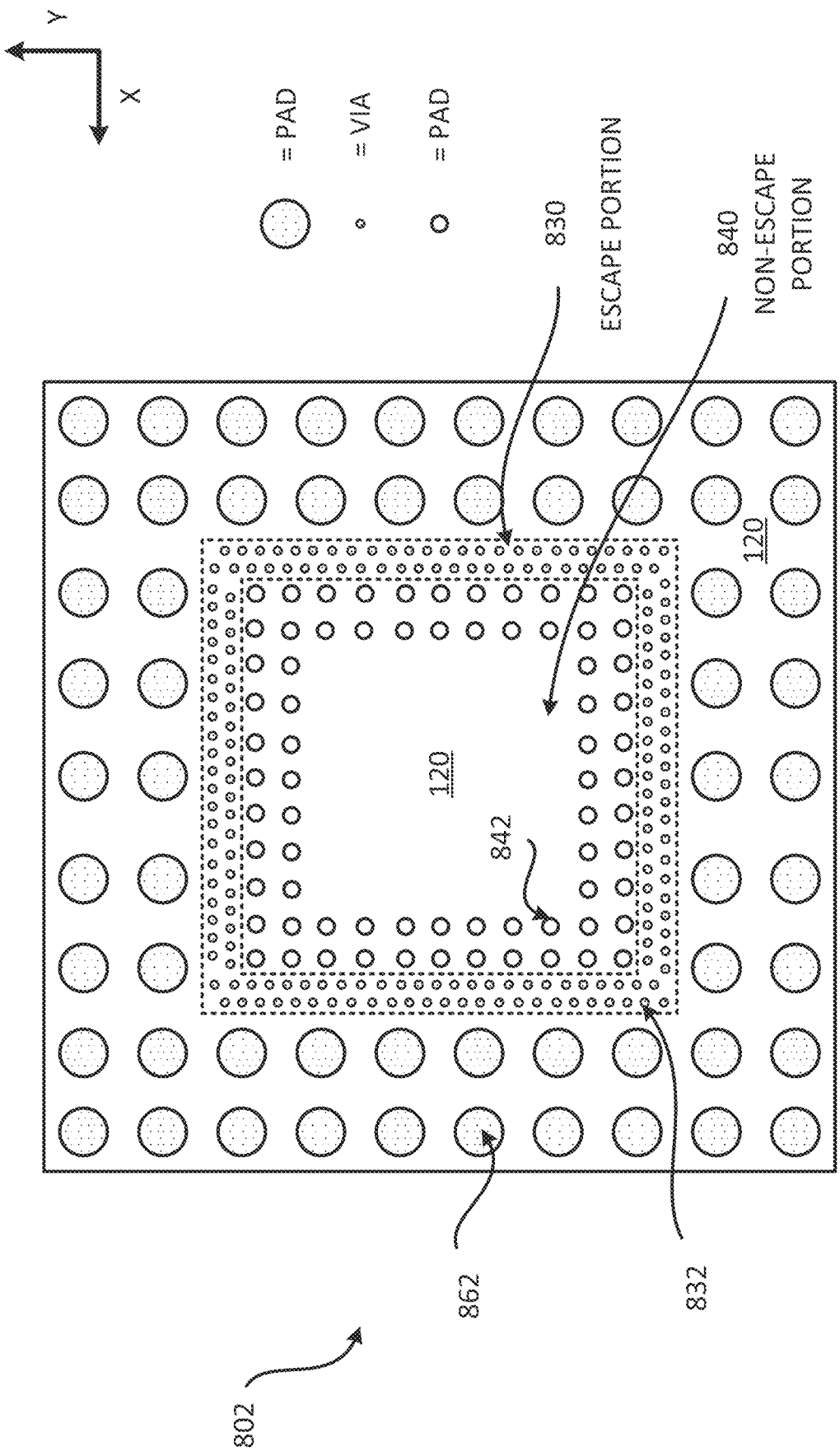
FIG. 8 illustrates an exemplary planar view of a substrate with a via interconnect having direct coupling to a trace interconnect in an escape portion of the substrate.

As mentioned above, one area where direct via interconnect coupling to trace interconnect may be implemented is in the escape portion of the substrate. FIG. 8 illustrates a substrate 802 that includes at least one dielectric layer 120, a plurality of interconnects 832, a plurality of interconnects 842, and a plurality of interconnects 862. The substrate 802 may represent an exemplary view and/or configuration of any of the substrates (e.g., 102, 302) described in the disclosure. The substrate 802 includes an escape portion 830 and a non-escape portion 840. The escape portion 830 and the non-escape portion 840 may be portions of the substrate 802 over which an integrated device (e.g., 104) may be located over when the integrated device is coupled to the substrate 802.

The plurality of interconnects 842 may be located in the non-escape portion 840 of the substrate 802. The plurality of interconnects 832 may be located in the escape portion 830 of the substrate 802. The plurality of interconnects 832 may be configured to provide at least one electrical path for input/output (I/O) signals to and from an integrated device. As mentioned above, the plurality of interconnects 832 may include via interconnects directly coupled to the trace interconnects. For the purpose of clarity, trace interconnects are not shown in FIG. 8. However, the substrate 802 may include trace interconnects in the escape portion 830 and the non-escape portion 840, as well as other portions of the substrate 802. The escape portion 830 of the substrate 802 includes high density routing. Pad interconnects take up a lot of real estate on the substrate. By eliminating and/or reducing the number of pads that are located in the escape portion 830 of the substrate, more room is made available for trace interconnects, resulting in high density routing, which may help reduce the size of the substrate and/or the package, while also improving the performance of the package. However, direct via interconnect coupling to trace interconnect may be implemented in any part of the substrate. A via interconnect that is directly coupled to a trace interconnect may also mean a trace interconnect that is directly coupled to a via interconnect. A trace interconnect that is directly coupled to a via interconnect may also mean a via interconnect that is directly coupled to a trace interconnect.

An integrated device (e.g., 104) may include a die (e.g., semiconductor bare die). An integrated device may include integrated circuits. The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 104) may include at least one electronic circuit (e.g., first electronic circuit, second electronic circuit, etc. . . . ). An integrated device may be an example of an electrical component and/or electrical device.

The package (e.g., 100, 300) may be implemented in a radio frequency (RF) package. The RF package may be a radio frequency front end (RFFE) package. A package (e.g., 100, 300) may be configured to provide Wireless Fidelity (WiFi) communication and/or cellular communication (e.g., 2G, 3G, 4G, 5G). The packages (e.g., 100, 300) may be configured to support Global System for Mobile (GSM) Communications, Universal Mobile Telecommunications System (UMTS), and/or Long-Term Evolution (LTE). The packages (e.g., 100, 300) may be configured to transmit and receive signals having different frequencies and/or communication protocols.

Having described various packages with a substrate, several methods for fabricating a substrate will now be described below.

Exemplary Sequence for Fabricating a Substrate

Figure 9A:
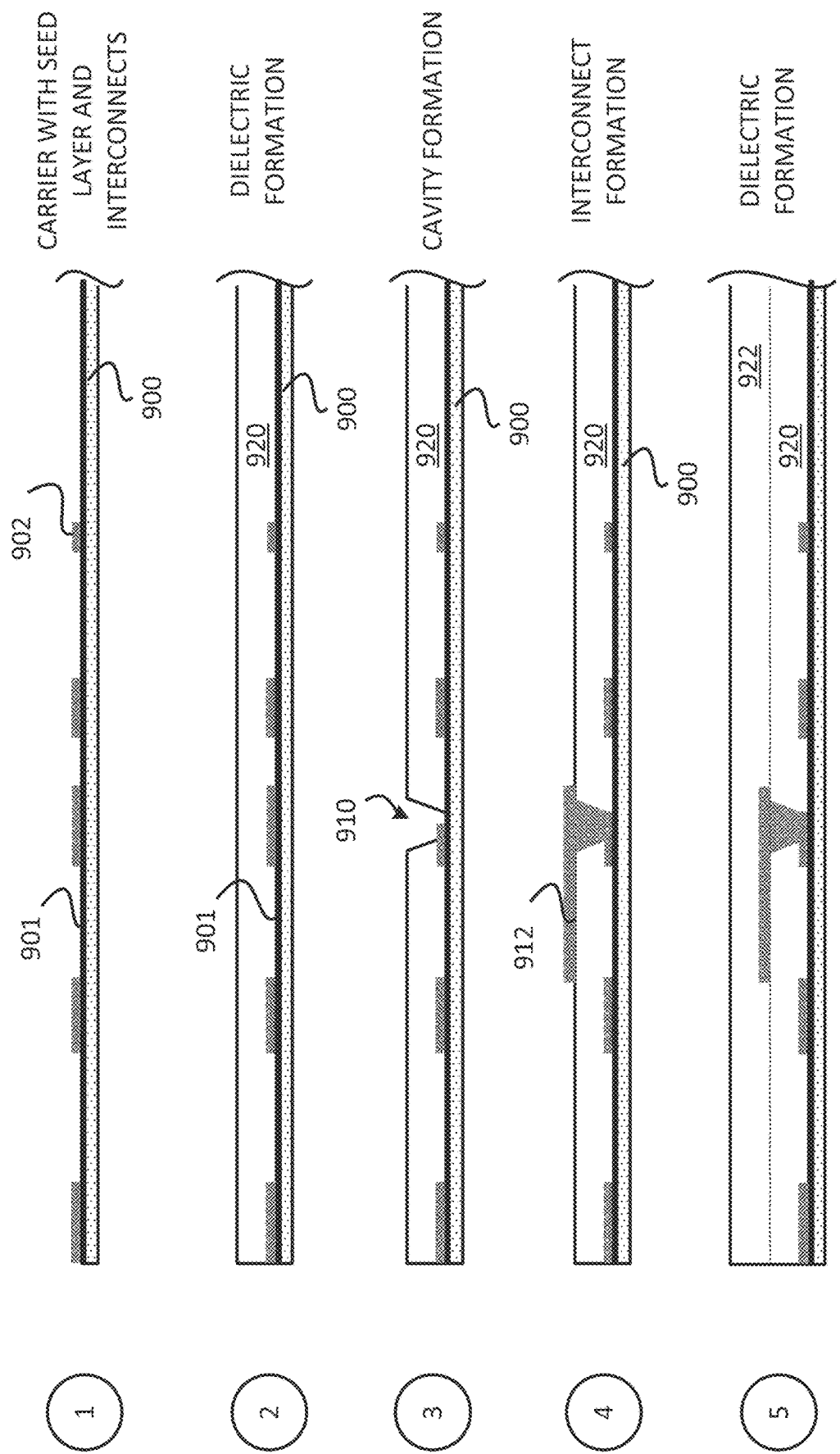
FIGS. 9A-9B illustrate an exemplary sequence for fabricating a substrate with a via interconnect having direct coupling to a trace interconnect.
Figure 9B:
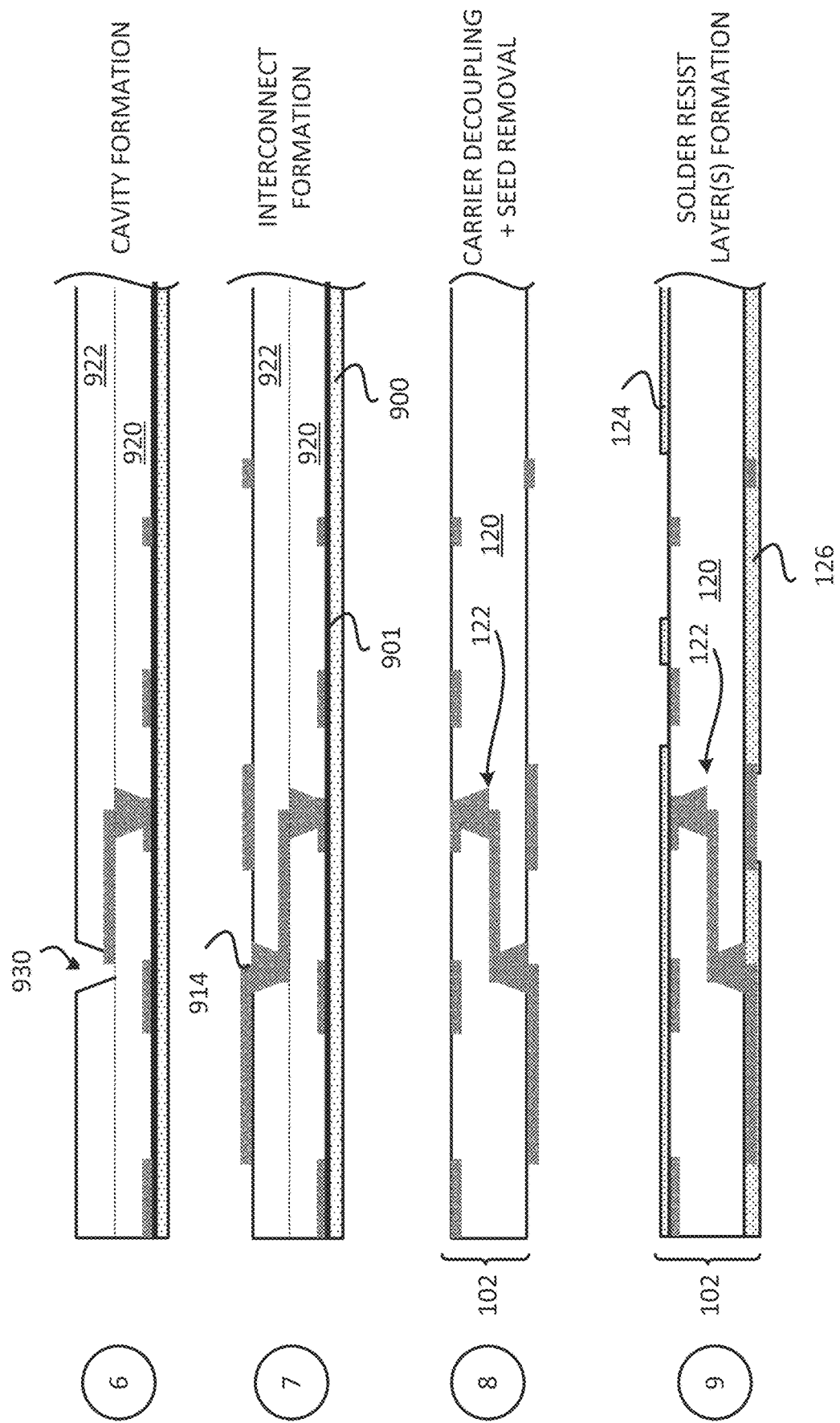

In some implementations, fabricating a substrate includes several processes. FIGS. 9A-9B illustrate an exemplary sequence for providing or fabricating a substrate. In some implementations, the sequence of FIGS. 9A-9B may be used to provide or fabricate the substrate 102. However, the process of FIGS. 9A-9B may be used to fabricate any of the substrates described in the disclosure.

It should be noted that the sequence of FIGS. 9A-9B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 9A, illustrates a state after a carrier 900 is provided. A seed layer 901 and interconnects 902 may be located over the carrier 900. The interconnects 902 may be located over the seed layer 901. A plating process and etching process may be used to form the interconnects 902. In some implementations, the carrier 900 may be provided with the seed layer 901 and a metal layer that is patterned to form the interconnects 902. The interconnects 902 may represent at least some of the interconnects from the plurality of interconnects 122.

Stage 2 illustrates a state after a dielectric layer 920 is formed over the carrier 900, the seed layer 901 and the interconnects 902. A deposition and/or lamination process may be used to form the dielectric layer 920. The dielectric layer 920 may include prepreg and/or polyimide. The dielectric layer 920 may include a photo-imagable dielectric. However, different implementations may use different materials for the dielectric layer.

Stage 3 illustrates a state after a plurality of cavities 910 is formed in the dielectric layer 920. The plurality of cavities 910 may be formed using an etching process (e.g., photo etching process) or laser process.

Stage 4 illustrates a state after interconnects 912 are formed in and over the dielectric layer 920, including in and over the plurality of cavities 910. For example, a via, pad and/or traces may be formed. Stage 4 may illustrate an example of direct coupling of a via interconnect to a trace interconnect. A plating process may be used to form the interconnects.

Stage 5 illustrates a state after a dielectric layer 922 is formed over the dielectric layer 920 and the interconnects 912. A deposition and/or lamination process may be used to form the dielectric layer 922. The dielectric layer 922 may include prepreg and/or polyimide. The dielectric layer 922 may include a photo-imagable dielectric. However, different implementations may use different materials for the dielectric layer.

Stage 6, as shown in FIG. 9B, illustrates a state after a plurality of cavities 930 is formed in the dielectric layer 922. The plurality of cavities 930 may be formed using an etching process (e.g., photo etching process) or laser process.

Stage 7 illustrates a state after interconnects 914 are formed in and over the dielectric layer 922, including in and over the plurality of cavities 930. For example, a via interconnect, a pad interconnect and/or trace interconnects may be formed. Stage 7 may illustrate an example of direct coupling of a via interconnect to a trace interconnect. Stage 7 may illustrate an example of direct coupling of a trace interconnect to a via interconnect. A plating process may be used to form the interconnects. In some implementations, a direct first via interconnect coupling to a first trace interconnect is formed, and then a direct second trace interconnect to the first via interconnect may be formed. Thus, for example, via interconnects may be formed in the plurality of cavities 930, which may result in a direct via interconnect coupling to a trace interconnect (from the plurality of interconnects 912), and then a trace interconnect may be formed that is directly coupled to the via interconnect formed in the cavity of the dielectric layer 922. The plurality of interconnects 902, the plurality of interconnects 912, and/or the plurality of interconnects 914 may be represented by the plurality of interconnects 122. The dielectric layer 920 and/or the dielectric layer 922 may be represented by the at least one dielectric layer 120. The at least one dielectric layer 120 may include a photo-imagable dielectric. The at least one dielectric layer 120 may include prepreg and/or polyimide. It is noted that additional dielectric layers and interconnects may be formed by iteratively performing stages 5-7.

Stage 8 illustrates a state after the carrier 900 is decoupled (e.g., detached, removed, grinded out) from the at least one dielectric layer 120 and the seed layer 901, portions of the seed layer 901 are removed (e.g., etched out), leaving the substrate 102 that includes the at least one dielectric layer 120 and the plurality of interconnects 122.

Stage 9 illustrates a state after the solder resist layer 124 and the solder resist layer 126 are formed over the substrate 102. A deposition process may be used to form the solder resist layer 124 and the solder resist layer 126. In some implementations, none or one solder resist layer may be formed over the at least one dielectric layer 120.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s). The process of forming one or more interconnects may include desmearing, masking, mask removal, and/or etching.

Exemplary Flow Diagram of a Method for Fabricating a Substrate

Figure 10:
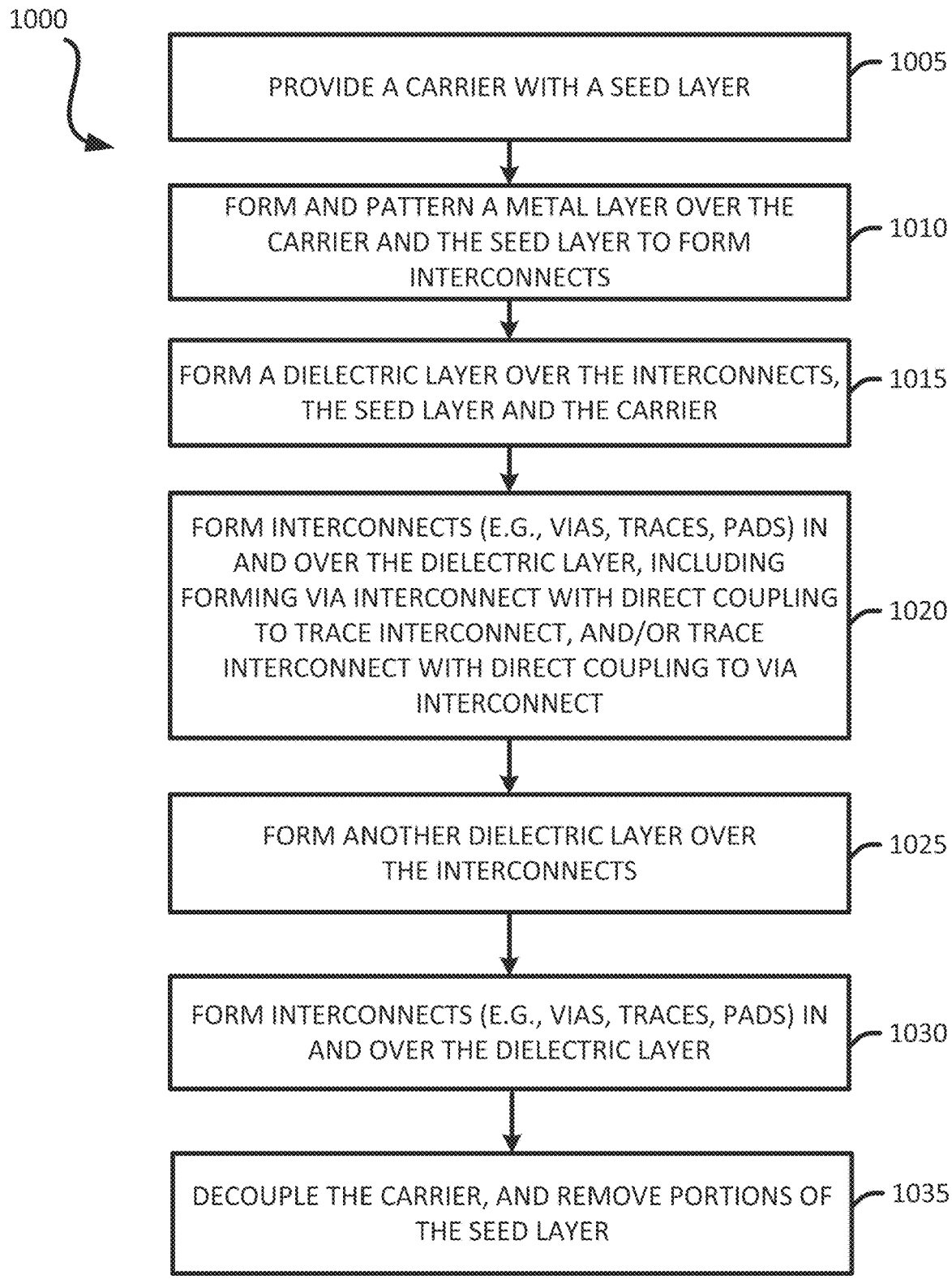
FIG. 10 illustrates an exemplary flow chart of a method for fabricating a substrate with a via interconnect having direct coupling to a trace interconnect.

In some implementations, fabricating a substrate includes several processes. FIG. 10 illustrates an exemplary flow diagram of a method 1000 for providing or fabricating a substrate. In some implementations, the method 1000 of FIG. 10 may be used to provide or fabricate the substrate(s) of FIGS. 1-2. For example, the method 1000 of FIG. 10 may be used to fabricate the substrate 102.

It should be noted that the method 1000 of FIG. 10 may combine one or more processes in order to simplify and/or clarify the method for providing or fabricating a substrate. In some implementations, the order of the processes may be changed or modified.

The method provides (at 1005) a carrier (e.g., 900). Different implementations may use different materials for the carrier 900. The carrier 900 may include a seed layer (e.g., 901). The seed layer 901 may include a metal (e.g., copper). The carrier may include a substrate, glass, quartz and/or carrier tape. Stage 1 of FIG. 9A illustrates and describes an example of a carrier with a seed layer that is provided.

The method forms and patterns (at 1010) interconnects over the carrier 900 and the seed layer 901. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 902). Stage 1 of FIG. 9A illustrates and describes an example of interconnects over a seed layer and a carrier.

The method forms (at 1015) a dielectric layer 920 over the seed layer 901, the carrier 900 and the interconnects 902. A deposition and/or lamination process may be used to form the dielectric layer 920. The dielectric layer 920 may include prepreg and/or polyimide. The dielectric layer 920 may include a photo-imagable dielectric. Forming the dielectric layer 920 may also include forming a plurality of cavities (e.g., 910) in the dielectric layer 920. The plurality of cavities may be formed using an etching process (e.g., photo etching) or laser process. Stages 2-3 of FIG. 9A illustrate and describe an example of forming a dielectric layer and cavities in the dielectric layer.

The method forms (at 1020) interconnects in and over the dielectric layer. For example, the interconnects 912 may be formed in and over the dielectric layer 920. A plating process may be used to form the interconnects. Forming interconnects may include providing a patterned metal layer over and/or in the dielectric layer. Forming interconnects may also include forming interconnects in cavities of the dielectric layer. In some implementations, at least some of the interconnects include a via interconnect directly coupled to a trace interconnect and/or a trace interconnect directly coupled to a via interconnect. Stage 4 of FIG. 9A illustrates and describes an example of forming interconnects in and over a dielectric layer.

The method forms (at 1025) a dielectric layer 922 over the dielectric layer 920 and the interconnects 912. A deposition and/or lamination process may be used to form the dielectric layer 922. The dielectric layer 922 may include prepreg and/or polyimide. The dielectric layer 922 may include a photo-imagable dielectric. Forming the dielectric layer 922 may also include forming a plurality of cavities (e.g., 930) in the dielectric layer 922. The plurality of cavities may be formed using an etching process (e.g., photo etching) or laser process. Stages 5-6 of FIGS. 9A-9B illustrate and describe an example of forming a dielectric layer and cavities in the dielectric layer.

The method forms (at 1030) interconnects in and over the dielectric layer. For example, the interconnects 914 may be formed in and over the dielectric layer 922. A plating process may be used to form the interconnects. Forming interconnects may include providing a patterned metal layer over and/or in the dielectric layer. Forming interconnects may also include forming interconnects in cavities of the dielectric layer. In some implementations, at least some of the interconnects include a via interconnect directly coupled to a trace interconnect and/or a trace interconnect directly coupled to a via interconnect. Stage 7 of FIG. 9B illustrates and describes an example of forming interconnects in and over a dielectric layer.

The method decouples (at 1035) the carrier (e.g., 900) from the seed layer (e.g., 901). The carrier 900 may be detached and/or grounded out. The method may also remove (at 1035) portions of the seed layer (e.g., 901). An etching process may be used to remove portions of the seed layer 901. Stage 8 of FIG. 9B illustrates and describes an example of decoupling a carrier and seed layer removal.

In some implementations, after the carrier(s) and seed layer(s) removal, the method may form solder resist layers (e.g., 124, 126) over the substrate. Stage 9 of FIG. 9B illustrates and describes an example of forming solder resist layers.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s). The process of forming one or more interconnects may include desmearing, masking, mask removal, and/or etching.

Exemplary Sequence for Fabricating a Substrate

Figure 11A:
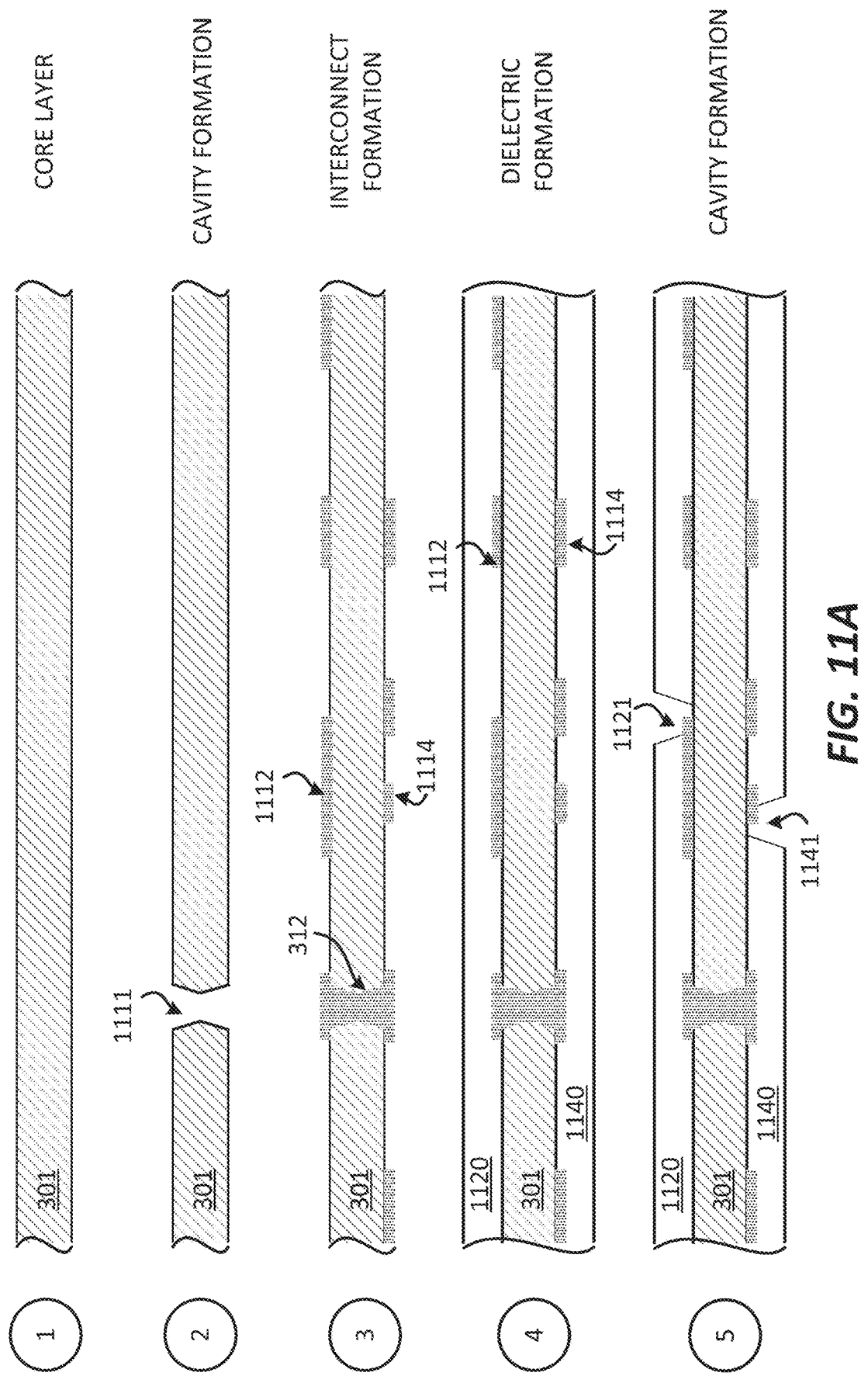
FIGS. 11A-11C illustrate an exemplary sequence for fabricating a substrate with a via interconnect having direct coupling to a trace interconnect.
Figure 11B:
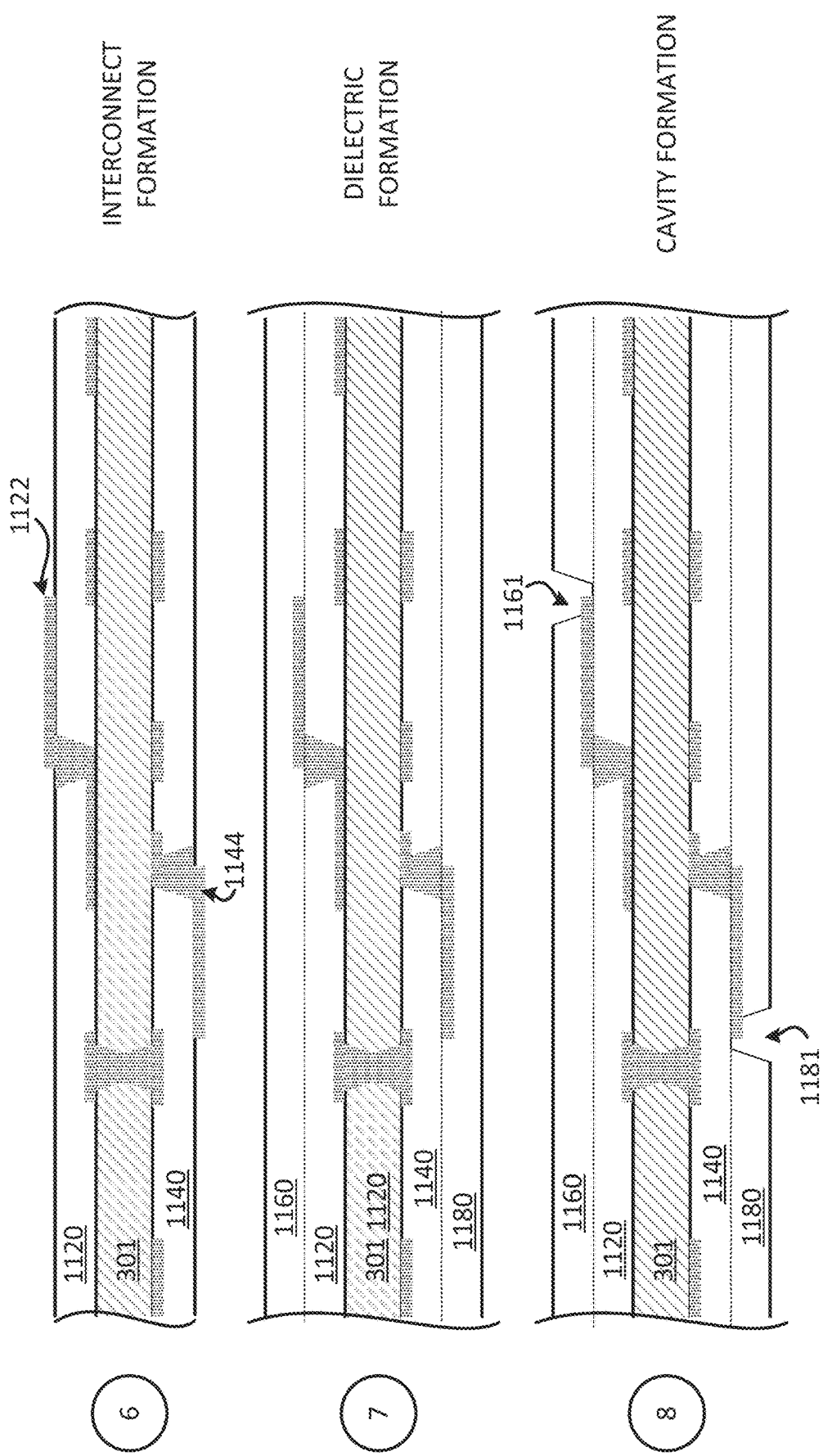
Figure 11C:
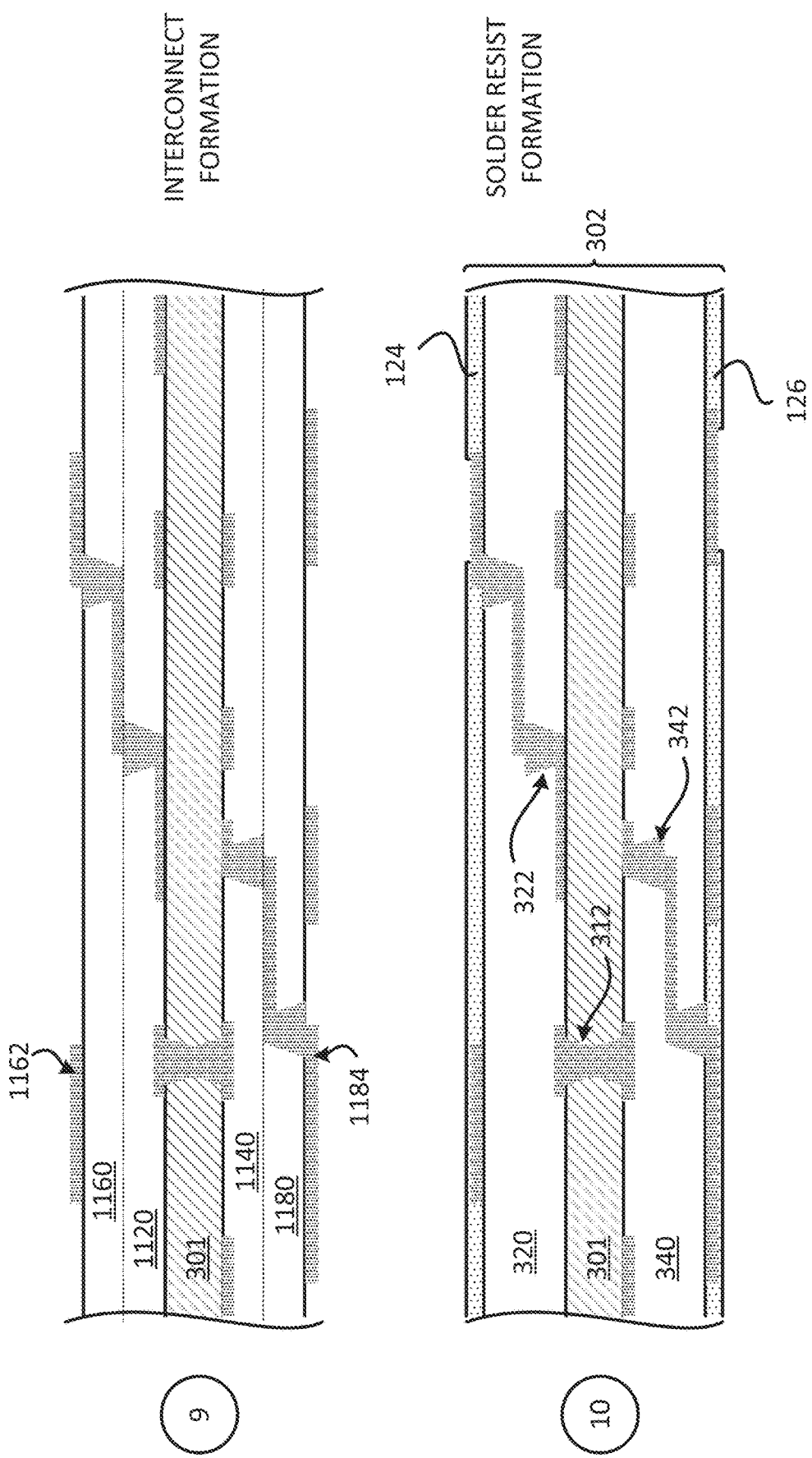

In some implementations, fabricating a substrate includes several processes. FIGS. 11A-11C illustrate an exemplary sequence for providing or fabricating a substrate. In some implementations, the sequence of FIGS. 11A-11C may be used to provide or fabricate the substrate 302. However, the process of FIGS. 11A-11C may be used to fabricate any of the substrates described in the disclosure.

It should be noted that the sequence of FIGS. 11A-11C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 11A, illustrates a state after a core layer 301 is provided. A first seed layer (not shown) may be located on a first surface (e.g., top surface) of the core layer 301 and a second seed layer (not shown) may be located on a second surface (e.g., bottom surface) of the core layer 301. A seed layer may include a metal layer (e.g., copper layer). When a seed layer is present, interconnects and/or dielectric layers may be formed over the core layer 301 and the seed layer(s).

Stage 2 illustrates a state after a plurality of cavities 1111 is formed in the core layer 301. A laser process (e.g., laser ablation) may be used to form at least one cavity that extends through the thickness of the core layer 301. The plurality of cavities 1111 may be formed through the first surface and the second surface of the core layer 301.

Stage 3 illustrates a state after a plurality of core interconnects 312 is formed in the plurality of cavities 1111. Stage 3 also illustrates a state after a plurality of interconnects 1112 is formed over the first surface of the core layer 301, and a plurality of interconnects 1114 is formed over the second surface of the core layer 301. A plating process may be used to form the core interconnects 312. A plating process and etching process may be used to form the interconnects 1112 and/or 1114. Some of the interconnects 1112 and/or 1114 may be coupled to the core interconnects 312.

Stage 4 illustrates a state after a dielectric layer 1120 is formed over the first surface of the core layer 301 and the plurality of interconnects 1112. Stage 4 also illustrates a state after a dielectric layer 1140 is formed over the second surface of the core layer 301 and the plurality of interconnects 1114. A deposition and/or lamination process may be used to form the dielectric layer 1120 and the dielectric layer 1140. The dielectric layer 1120 and/or the dielectric layer 1140 may include polyimide. The dielectric layer 1120 and/or the dielectric layer 1140 may include a photo imagable dielectric. However, different implementations may use different materials for the dielectric layer.

Stage 5 illustrates a state after a plurality of cavities 1121 is formed in the dielectric layer 1120, and a plurality of cavities 1141 is formed in the dielectric layer 1140. The plurality of cavities 1121 and/or the plurality of cavities 1141 may be formed using an etching process (e.g., photo etching process) or laser process.

Stage 6, as shown in FIG. 11B, illustrates a state after a plurality of interconnects 1122 is formed over the dielectric layer 1120, and a plurality of interconnects 1144 is formed over the dielectric layer 1140. Some of the interconnects from the plurality of interconnects 1122 may include via interconnects directly coupled to trace interconnects and/or trace interconnects directly coupled to trace interconnects. Some of the interconnects from the plurality of interconnects 1144 may include via interconnects directly coupled to trace interconnects and/or trace interconnects directly coupled to via interconnects. A plating process and etching process may be used to form the plurality of interconnects 1122 and/or the plurality of interconnects 1144.

Stage 7 illustrates a state after a dielectric layer 1160 is formed over the dielectric layer 1120 and the plurality of interconnects 1122. Stage 7 also illustrates a state after a dielectric layer 1180 is formed over the dielectric layer 1140 and the plurality of interconnects 1144. A deposition and/or lamination process may be used to form the dielectric layer 1160 and the dielectric layer 1180. The dielectric layer 1160 and/or the dielectric layer 1180 may include polyimide. The dielectric layer 1160 and/or the dielectric layer 1180 may include a photo imagable dielectric. However, different implementations may use different materials for the dielectric layer.

Stage 8 illustrates a state after a plurality of cavities 1161 is formed in the dielectric layer 1160, and a plurality of cavities 1181 is formed in the dielectric layer 1180. The plurality of cavities 1161 and/or the plurality of cavities 1181 may be formed using an etching process (e.g., photo etching process) or laser process.

Stage 9, as shown in FIG. 11C, illustrates a state after a plurality of interconnects 1162 is formed over the dielectric layer 1160, and a plurality of interconnects 1184 is formed over the dielectric layer 1180. Some of the interconnects from the plurality of interconnects 1162 may include via interconnects directly coupled to trace interconnects and/or trace interconnects directly coupled to via interconnects. Some of the interconnects from the plurality of interconnects 1184 may include via interconnects directly coupled to trace interconnects and/or trace interconnects directly coupled to via interconnects. A plating process and etching process may be used to form the plurality of interconnects 1162 and/or the plurality of interconnects 1184. The dielectric layer 1120 and/or the dielectric layer 1160 may be represented by the at least one dielectric layer 320. The plurality of interconnects 1112, the plurality of interconnects 1122 and/or the plurality of interconnects 1162 may be represented by the plurality of interconnects 322. The dielectric layer 1140 and/or the dielectric layer 1180 may be represented by the at least one dielectric layer 340. The plurality of interconnects 1114, the plurality of interconnects 1144 and/or the plurality of interconnects 1184 may be represented by the plurality of interconnects 342.

Stage 10 illustrates a state after the solder resist layer 124 is formed over the at least one dielectric layer 320 and the solder resist layer 126 is formed over the at least one dielectric layer 340. A deposition process may be used to form the solder resist layer 124 and the solder resist layer 126. In some implementations, none or one solder resist layer may be formed over the at least one dielectric layer 320 and/or the at least one dielectric layer 340. The solder resist layer 124 and the solder resist layer 126 may considered part of the substrate 302.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s). The process of forming one or more interconnects may include desmearing, masking, mask removal, and/or etching.

Exemplary Flow Diagram of a Method for Fabricating a Substrate

Figure 12:
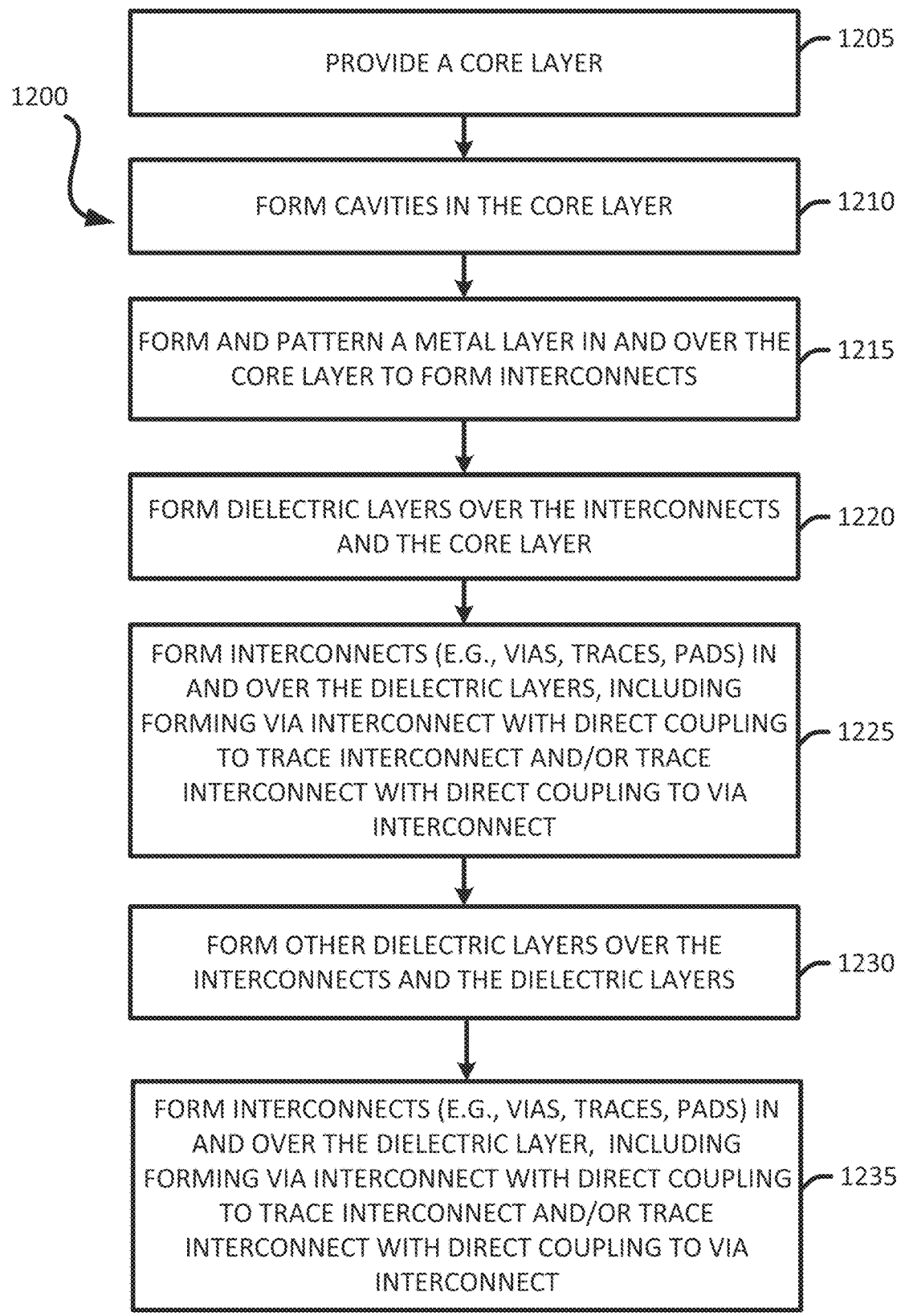
FIG. 12 illustrates an exemplary flow chart of a method for fabricating a substrate with a via interconnect having direct coupling to a trace interconnect.

In some implementations, fabricating a substrate includes several processes. FIG. 12 illustrates an exemplary flow diagram of a method 1200 for providing or fabricating a substrate. In some implementations, the method 1200 of FIG. 12 may be used to provide or fabricate the substrate(s) of FIGS. 3-4. For example, the method 1200 of FIG. 12 may be used to fabricate the substrate 302.

It should be noted that the method 1200 of FIG. 12 may combine one or more processes in order to simplify and/or clarify the method for providing or fabricating a substrate. In some implementations, the order of the processes may be changed or modified.

The method provides (at 1205) a core layer (e.g., 301). Different implementations may use different materials for the core layer 301. In some implementations, a first seed layer (not shown) may be located on a first surface (e.g., top surface) of the core layer 301 and a second seed layer (e.g., not shown) may be located on a second surface (e.g., bottom surface) of the core layer 301. A seed layer may include a metal layer (e.g., copper layer). Stage 1 of FIG. 11A illustrates and describes an example of a core layer that is provided.

The method forms (at 1210) cavities (e.g., 1111) in the core layer (e.g., 301). A laser process (e.g., laser ablation) may be used to form at least one cavity that extends through the thickness of the core layer 301. The cavities 1111 may be formed through the first surface and the second surface of the core layer 301. Stage 2 of FIG. 11A illustrates and describes an example of forming cavities in a core layer.

The method forms and patterns (at 1215) metal layer(s) in and over the core layer to forms a plurality of interconnects. For example, a plurality of core interconnects 312 may be formed in the plurality of cavities 1111. A plurality of interconnects 1112 may be formed over the first surface of the core layer 301, and a plurality of interconnects 1114 may be formed over the second surface of the core layer 301. A plating process and etching process may be used to form the interconnects 1112 and/or 1114. Stage 3 of FIG. 11A illustrates and describes an example of forming interconnects.

The method forms (at 1220) dielectric layers over the core layer. For example, a dielectric layer 1120 may be formed over the first surface of the core layer 301 and the plurality of interconnects 1112. A dielectric layer 1140 may be formed over the second surface of the core layer 301 and the plurality of interconnects 1114. A deposition and/or lamination process may be used to form the dielectric layer 1120 and the dielectric layer 1140. The dielectric layer 1120 and/or the dielectric layer 1140 may include polyimide. However, different implementations may use different materials for the dielectric layer. Stage 4 of FIG. 11A illustrates and describes an example of forming dielectric layers.

The method forms (at 1225) interconnects in and/or over dielectric layers. Forming interconnects may include forming cavities in the dielectric layers. For example, a plurality of cavities 1121 may be formed in the dielectric layer 1120, and a plurality of cavities 1141 may be formed in the dielectric layer 1140. The plurality of cavities 1121 and/or the plurality of cavities 1141 may be formed using an etching process (e.g., photo etching process) or laser process. Forming a plurality of interconnects may include forming a plurality of interconnects 1122 over the dielectric layer 1120, and forming a plurality of interconnects 1144 over the dielectric layer 1140. Some of the interconnects from the plurality of interconnects 1122 may include via interconnects directly coupled to trace interconnects and/or trace interconnects directly coupled to via interconnects. Some of the interconnects from the plurality of interconnects 1144 may include via interconnects directly coupled to trace interconnects and/or trace interconnects directly coupled to via interconnects. A plating process and etching process may be used to form the plurality of interconnects 1122 and/or the plurality of interconnects 1144. Stages 5-6 of FIGS. 11A-11B illustrate and describe an example of forming cavities and interconnects.

The method forms (at 1230) additional dielectric layers (e.g., 1160, 1180) over dielectric layers and interconnects. For example, a dielectric layer 1160 may be formed over the dielectric layer 1120 and the plurality of interconnects 1122. A dielectric layer 1180 may be formed over the dielectric layer 1140 and the plurality of interconnects 1144. A deposition and/or lamination process may be used to form the dielectric layer 1160 and the dielectric layer 1180. The dielectric layer 1160 and/or the dielectric layer 1180 may include polyimide. However, different implementations may use different materials for the dielectric layer. Stage 7 of FIG. 11B illustrates and describes an example of forming dielectric layers.

The method forms (at 1235) interconnects in and/or over dielectric layers. Forming interconnects may include forming cavities in the dielectric layers. For example, a plurality of cavities 1161 may be formed in the dielectric layer 1160, and a plurality of cavities 1181 may be formed in the dielectric layer 1180. The plurality of cavities 1161 and/or the plurality of cavities 1181 may be formed using an etching process (e.g., photo etching process) or laser process. A plurality of interconnects 1162 may be formed over the dielectric layer 1160, and a plurality of interconnects 1184 may be formed over the dielectric layer 1180. Some of the interconnects from the plurality of interconnects 1162 may include via interconnects directly coupled to trace interconnects and/or trace interconnects directly coupled to via interconnects. Some of the interconnects from the plurality of interconnects 1184 may include via interconnects directly coupled to trace interconnects and/or trace interconnects directly coupled to via interconnects. A plating process and etching process may be used to form the plurality of interconnects 1162 and/or the plurality of interconnects 1184. The dielectric layer 1120 and/or the dielectric layer 1160 may be represented by the at least one dielectric layer 320. The plurality of interconnects 1112, the plurality of interconnects 1122 and/or the plurality of interconnects 1162 may be represented by the plurality of interconnects 322. The dielectric layer 1140 and/or the dielectric layer 1180 may be represented by the at least one dielectric layer 340. The plurality of interconnects 1114, the plurality of interconnects 1144 and/or the plurality of interconnects 1184 may be represented by the plurality of interconnects 342.

Stages 8-9 of FIGS. 11B-11C illustrate and describe an example of forming cavities and interconnects.

In some implementations, the method may form solder resist layers (e.g., 124, 126) over the substrate (e.g., 302). Stage 10 of FIG. 11C illustrates and describes an example of forming solder resist layers.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s). The process of forming one or more interconnects may include desmearing, masking, mask removal, and/or etching.

Figure 13:
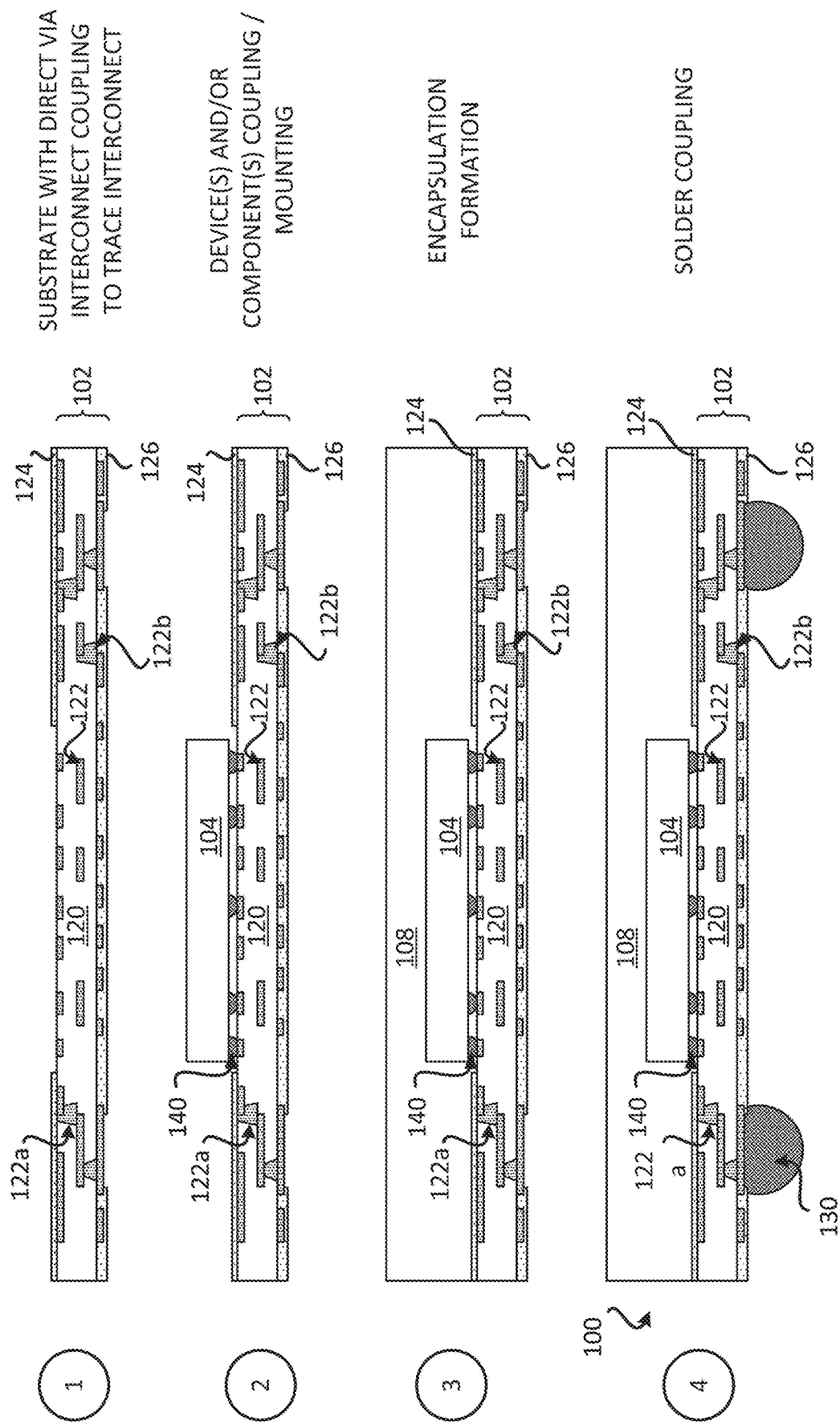
FIG. 13 illustrate an exemplary sequence for fabricating a package comprising a substrate with a via interconnect having direct coupling to a trace interconnect.

Exemplary Sequence for Fabricating a Package Comprising a Substrate with Direct Via Interconnect Coupling to Trace Interconnect In some implementations, fabricating a package includes several processes. FIG. 13 illustrates an exemplary sequence for providing or fabricating a package that includes a substrate with interconnects. In some implementations, the sequence of FIG. 13 may be used to provide or fabricate the package 100. However, the process of FIG. 13 may be used to fabricate any of the packages described in the disclosure.

It should be noted that the sequence of FIG. 13 may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 13 illustrates a state after a substrate 102 is provided. The substrate 102 includes at least one dielectric layer 120, a plurality of interconnects 122, a solder resist layer 124, and a solder resist layer 126.

As mentioned in FIG. 2, the plurality of interconnects 122 may include the via interconnect 122a, a trace interconnect 122c and a trace interconnect 122d. The trace interconnect 122c is directly coupled to the via interconnect 122a. In this example, the trace interconnect 122c is coupled to a surface (e.g., bottom surface) of the via interconnect 122a without an intervening pad interconnect between the via interconnect 122a and the trace interconnect 122c. The trace interconnect 122d is directly coupled to the via interconnect 122a. In this example, the trace interconnect 122d is coupled to a side portion (e.g., side surface) of the via interconnect 122a without an intervening pad interconnect between the via interconnect 122a and the trace interconnect 122d. In some implementations, the trace interconnect 122d may be considered embedded in the via interconnect 122a. Different implementations may use different substrates with different numbers of metal layers. The substrate 102 may be fabricated using the method as described in FIGS. 9A-9B.

Stage 2 illustrates a state after the integrated device 104 is coupled to the substrate 102 through the plurality of solder interconnects 140. A solder reflow process may be used to couple the integrated device 104 to the substrate 102. The integrated device 104 may be coupled to the first surface (e.g., top surface) of the substrate 102. FIG. 2 illustrates an example of how the integrated device 104 may be coupled to the substrate 102. Different implementations may couple different components and/or devices to the substrate 102.

Stage 3 illustrates a state after an encapsulation layer 108 is provided (e.g., formed) over the first surface of the substrate 102. The encapsulation layer 108 may encapsulate the integrated device 104. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Stage 4 illustrates a state after a plurality of solder interconnects 130 is coupled to the substrate 102. A solder reflow process may be used to couple the plurality of solder interconnects 130 to the substrate 102. The plurality of solder interconnects 130 may be coupled to the plurality of interconnects 122.

The packages (e.g., 100) described in the disclosure may be fabricated one at a time or may be fabricated together as part of one or more wafers and then singulated into individual packages.

Figure 14:
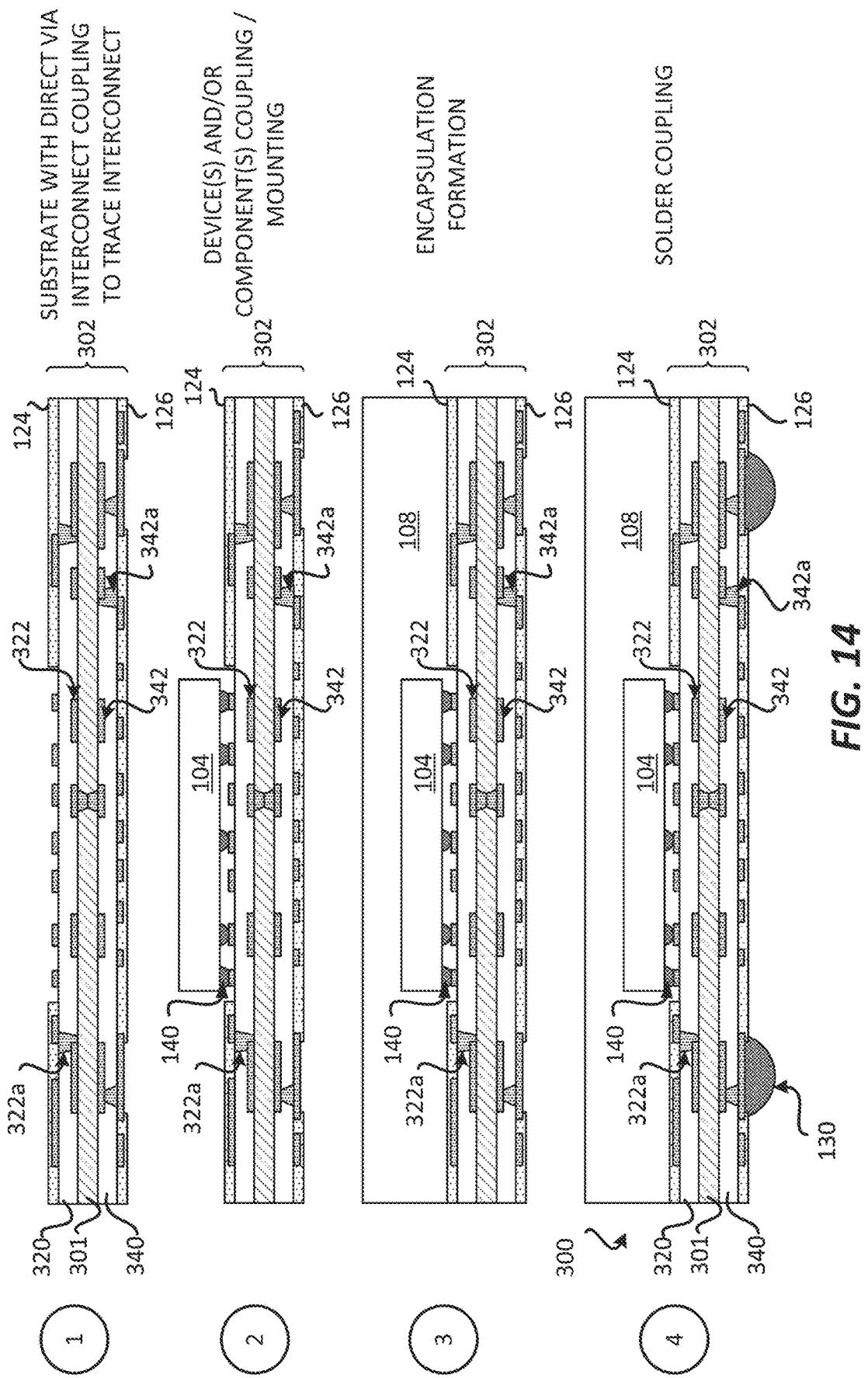
FIG. 14 illustrate an exemplary sequence for fabricating a package comprising a substrate with a via interconnect having direct coupling to a trace interconnect.

Exemplary Sequence for Fabricating a Package Comprising a Substrate with Direct Via Interconnect Coupling to Trace Interconnect In some implementations, fabricating a package includes several processes. FIG. 14 illustrates an exemplary sequence for providing or fabricating a package that includes a substrate with interconnects. In some implementations, the sequence of FIG. 14 may be used to provide or fabricate the package 300. However, the process of FIG. 14 may be used to fabricate any of the packages described in the disclosure.

It should be noted that the sequence of FIG. 14 may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 14 illustrates a state after a substrate 302 is provided. The substrate 302 includes a core layer 301, at least one dielectric layer 320, at least one dielectric layer 340, a plurality of core interconnects 312, a plurality of interconnects 322, a plurality of interconnects 342, a solder resist layer 124, and a solder resist layer 126. The substrate 302 may include a first surface (e.g., top surface) and a second surface (e.g., bottom surface). The solder resist layer 124 may be located on the first surface of the substrate 302. The solder resist layer 126 may be located on the second surface of the substrate 302. The plurality of interconnects 322 includes a via interconnect 322a. The plurality of interconnects 342 includes a via interconnect 342a. As mentioned in FIG. 4, a via interconnect (e.g., 322a, 342a) may be directly coupled to one or more trace interconnects, bypassing the need for an intervening pad interconnect between a via interconnect and a trace interconnect. Different implementations may use different substrates with different numbers of metal layers. The substrate 302 may be fabricated using the method as described in FIGS. 11A-11C.

Stage 2 illustrates a state after the integrated device 104 is coupled to the substrate 302 through the plurality of solder interconnects 140. A solder reflow process may be used to couple the integrated device 104 to the substrate 302. The integrated device 104 may be coupled to the first surface (e.g., top surface) of the substrate 302. FIG. 4 illustrates an example of how the integrated device 104 may be coupled to the substrate 302. Different implementations may couple different components and/or devices to the substrate 302.

Stage 3 illustrates a state after an encapsulation layer 108 is provided (e.g., formed) over the first surface of the substrate 302. The encapsulation layer 108 may encapsulate the integrated device 104. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Stage 4 illustrates a state after a plurality of solder interconnects 130 is coupled to the substrate 302. A solder reflow process may be used to couple the plurality of solder interconnects 130 to the substrate 302. The plurality of solder interconnects 130 may be coupled to the plurality of interconnects 342.

The packages (e.g., 300) described in the disclosure may be fabricated one at a time or may be fabricated together as part of one or more wafers and then singulated into individual packages.

Figure 15:
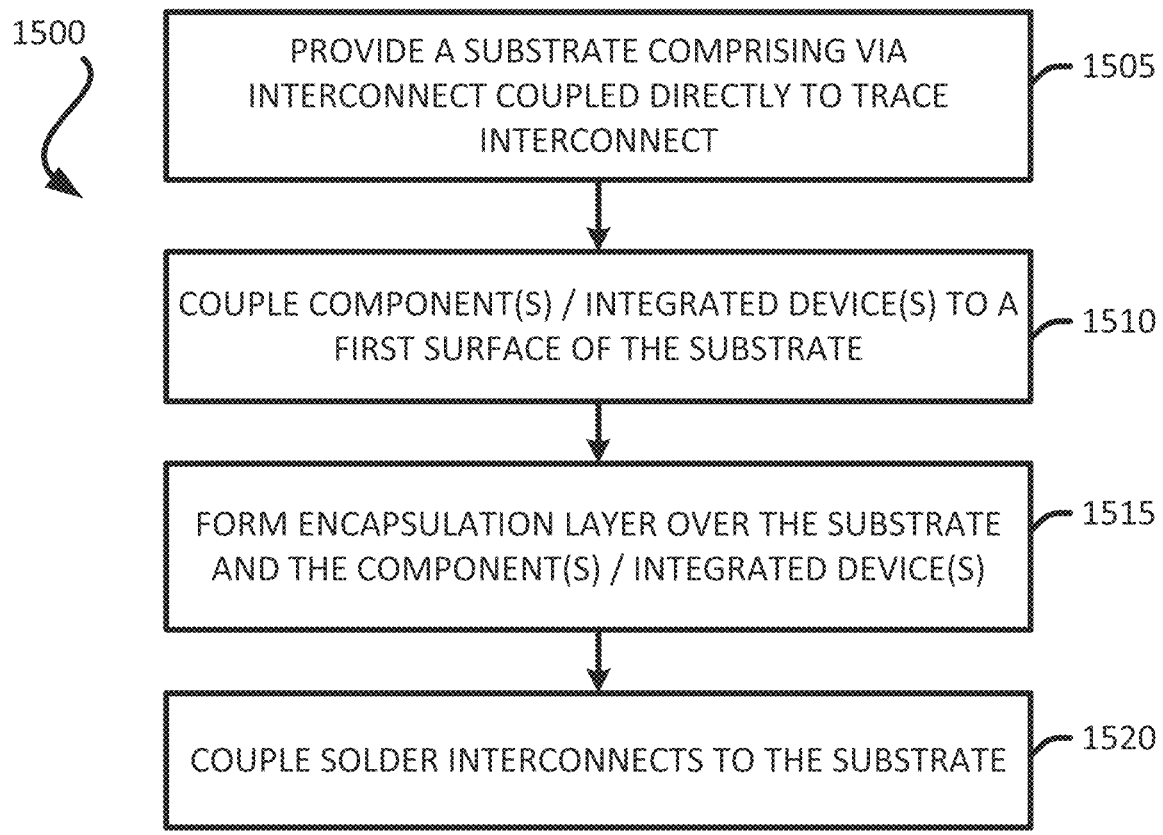
FIG. 15 illustrates an exemplary flow chart of a method for fabricating a package comprising a substrate with a via interconnect having direct coupling to a trace interconnect.

Exemplary Flow Diagram of a Method for Fabricating a Package Comprising a Substrate with High-Density Interconnects In some implementations, fabricating a package includes several processes. FIG. 15 illustrates an exemplary flow diagram of a method 1500 for providing or fabricating a package comprising a substrate with interconnects. In some implementations, the method 1500 of FIG. 15 may be used to provide or fabricate the package 100 described in the disclosure. However, the method 1500 may be used to provide or fabricate any of the packages (e.g., 300) described in the disclosure.

It should be noted that the method of FIG. 15 may combine one or more processes in order to simplify and/or clarify the method for providing or fabricating a package. In some implementations, the order of the processes may be changed or modified.

The method provides (at 1505) a substrate (e.g., 102, 302). The substrate may be provided by a supplier or fabricated. The substrate 102 includes at least one dielectric layer 120, a plurality of interconnects 122, a solder resist layer 124, and a solder resist layer 126. The substrate 302 includes a core layer 301, at least one dielectric layer 320, at least one dielectric layer 340, a plurality of core interconnects 312, a plurality of interconnects 322, a plurality of interconnects 342, a solder resist layer 124, and a solder resist layer 126. Different implementations Different implementations may use different processes to fabricate the substrate. FIGS. 9A-9B illustrates and describes an example of fabricating a substrate with interconnects. FIGS. 11A-11C illustrates and describes an example of fabricating a cored substrate with interconnects. Stage 1 of FIG. 13, illustrates and describes an example of providing a substrate with interconnects. Stage 1 of FIG. 14, illustrates and describes an example of providing a substrate with interconnects.

The method couples (at 1510) an integrated device (e.g., 104) to the substrate. For example, the integrated device 104 may be coupled to a first surface (e.g., top surface) of the substrate 102. The integrated device 104 is coupled to the substrate 102 through the plurality of solder interconnects 140. A solder reflow process may be used to couple the integrated device 104 to the substrate 102. Stage 2 of FIG. 13, illustrates and describes an example of coupling an integrated device to a substrate. Stage 2 of FIG. 14, illustrates and describes an example of coupling an integrated device to a substrate.

The method forms (at 1515) an encapsulation layer (e.g., 108) over the first surface of the substrate (e.g., 102, 302). The encapsulation layer 108 may be provided and formed over and/or around the substrate (e.g., 102, 302) and the integrated device 104. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation. Stage 3 of FIG. 13, illustrates and describes an example of forming an encapsulation layer. Stage 3 of FIG. 14, illustrates and describes an example of forming an encapsulation layer.

The method couples (at 1520) a plurality of solder interconnects (e.g., 130) to the substrate (e.g., 102, 302). A solder reflow process may be used to couple the plurality of solder interconnects 130 to the substrate. Stage 4 of FIG. 13, illustrates and describes an example of coupling solder interconnects to a substrate. Stage 4 of FIG. 14, illustrates and describes an example of coupling solder interconnects to a substrate.

The packages (e.g., 100, 300) described in the disclosure may be fabricated one at a time or may be fabricated together as part of one or more wafers and then singulated into individual packages.

Exemplary Electronic Devices

Figure 16:
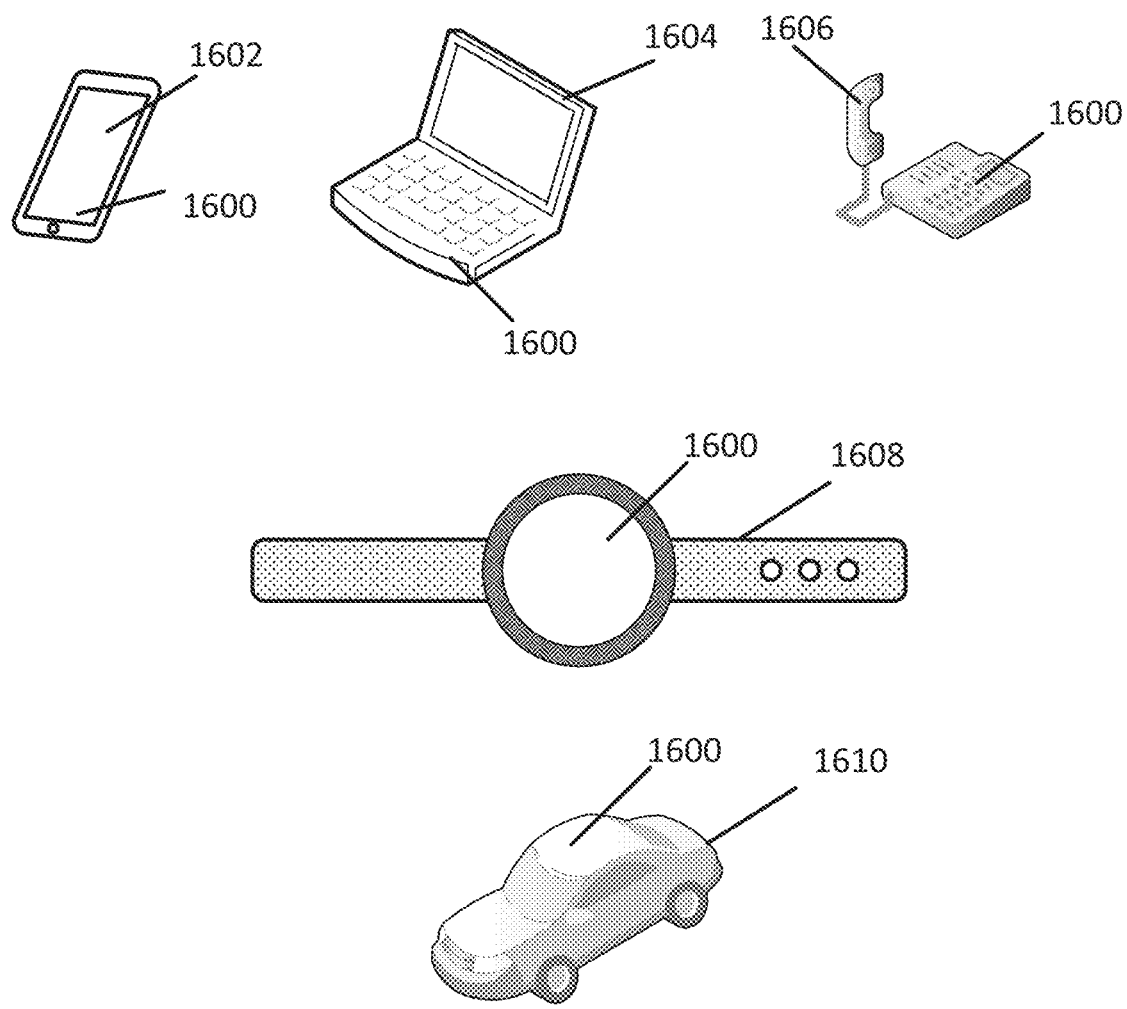
FIG. 16 illustrates various electronic devices that may integrate a die, an electronic circuit, an integrated device, an integrated passive device (IPD), a passive component, a package, and/or a device package described herein.

FIG. 16 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1602, a laptop computer device 1604, a fixed location terminal device 1606, a wearable device 1608, or automotive vehicle 1610 may include a device 1600 as described herein. The device 1600 may be, for example, any of the devices and/or integrated circuit (IC) packages described herein. The devices 1602, 1604, 1606 and 1608 and the vehicle 1610 illustrated in FIG. 16 are merely exemplary. Other electronic devices may also feature the device 1600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-8, 9A-9B, 10, 11A-11C, and/or 12-16 may be rearranged and/or combined into a single component, process, feature or function or embodied in several components, processes, or functions. Additional elements, components, processes, and/or functions may also be added without departing from the disclosure. It should also be noted FIGS. 1-8, 9A-9B, 10, 11A-11C, and/or 12-16 and its corresponding description in the present disclosure is not limited to dies and/or ICs. In some implementations, FIGS. 1-8, 9A-9B, 10, 11A-11C, and/or 12-16 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. There may or may not be one or more interfaces between interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects. The process of forming one or more interconnects may include desmearing, masking, mask removal, and/or etching.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate and an integrated device coupled to the substrate. The substrate includes at least one dielectric layer and a plurality of interconnects comprising a first via interconnect and a first trace interconnect, wherein the first via interconnect is directly coupled to the first trace interconnect.

Aspect 2: The package of aspect 1, wherein the first via interconnect is coupled to the first trace interconnect without an intervening pad interconnect between the first via interconnect and the first trace interconnect.

Aspect 3: The package of aspects 1 through 2, wherein the plurality of interconnects includes a second trace interconnect that is directly coupled to the first via interconnect.

Aspect 4: The package of aspect 3, wherein the first trace interconnect is coupled to a side portion of the first via interconnect, and wherein the second trace interconnect is coupled to a first surface of the first via interconnect.

Aspect 5: The package of aspect 4, wherein the first via interconnect includes a first width, wherein the first trace interconnect includes a second width that is less than the first width, and wherein the second trace interconnect includes a third width that is less than the first width.

Aspect 6: The package of aspects 1 through 5, wherein the plurality of interconnects includes a second trace interconnect that is parallel and adjacent to the first trace interconnect, and wherein a minimum spacing between the second trace interconnect and the first via interconnect is about 25 micrometers.

Aspect 7: The package of aspects 1 through 5, wherein the plurality of interconnects includes a second trace interconnect that is parallel and adjacent to the first trace interconnect, and wherein a spacing between the second trace interconnect and the first via interconnect is less than 45 micrometers.

Aspect 8: The package of aspects 1 through 7, wherein the first trace interconnect and the via interconnect are located in an escape portion of the substrate.

Aspect 9: The package of aspects 1 through 8, wherein the first trace interconnect is coupled to less than a top surface of the first via interconnect.

Aspect 10: The package of aspects 1 through 9, wherein the substrate includes a core layer.

Aspect 11: An apparatus comprising a substrate. The substrate includes at least one dielectric layer and a plurality of interconnects comprising a first via interconnect and a first trace interconnect, wherein the first via interconnect is directly coupled to the first trace interconnect.

Aspect 12: The apparatus of aspect 11, wherein the first via interconnect is coupled to the first trace interconnect without an intervening pad interconnect between the first via interconnect and the first trace interconnect.

Aspect 13: The apparatus of aspects 11 through 12, wherein the plurality of interconnects includes a second trace interconnect that is directly coupled to the first via interconnect.

Aspect 14: The apparatus of aspect 13, wherein the first trace interconnect is coupled to a side portion of the first via interconnect, and wherein the second trace interconnect is coupled to a first surface of the first via interconnect.

Aspect 15: The apparatus of aspect 14, wherein the first via interconnect includes a first width, wherein the first trace interconnect includes a second width that is less than the first width, and wherein the second trace interconnect includes a third width that is less than the first width.

Aspect 16: The apparatus of aspects 11 through 15, wherein the plurality of interconnects includes a second trace interconnect that is parallel and adjacent to the first trace interconnect, and wherein a minimum spacing between the second trace interconnect and the first via interconnect is about 25 micrometers.

Aspect 17: The apparatus of aspects 11 through 15, wherein the plurality of interconnects includes a second trace interconnect that is parallel and adjacent to the first trace interconnect, and wherein a spacing between the second trace interconnect and the first via interconnect is less than 45 micrometers.

Aspect 18: The apparatus of aspects 11 through 17, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 19: A method for fabricating a substrate. The method provides at least one dielectric layer. The method forms a plurality of interconnects comprising a first via interconnect and a first trace interconnect, wherein the first via interconnect is formed such that the first via interconnect is directly coupled to the first trace interconnect.

Aspect 20: The method of aspect 19, wherein the first via interconnect is coupled to the first trace interconnect without an intervening pad interconnect between the first via interconnect and the first trace interconnect.

Aspect 21: The method of aspects 19 through 20, wherein forming the plurality of interconnects includes forming a second trace interconnect that is directly coupled to the first via interconnect.

Aspect 22: The method of aspect 21, wherein the first trace interconnect is coupled to a side portion of the first via interconnect, and wherein the second trace interconnect is coupled to a first surface of the first via interconnect.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
a plurality of interconnects comprising:
a first via interconnect that includes a first width and
a first trace interconnect directly coupled to a side portion of the first via interconnect;
a second trace interconnect directly coupled to a first surface of the first via interconnect;
wherein the first trace interconnect includes a second width that is less than the first width and the second trace interconnect includes a third width that is less than the first width;
at least one dielectric layer at least partially surrounding the plurality of interconnects; and
an integrated device coupled to the substrate and located over the substrate, wherein the at least one dielectric layer and the plurality of interconnects are located in planes underneath the integrated device.

2. The package of claim 1, wherein the first via interconnect is coupled to the first trace interconnect without an intervening pad interconnect between the first via interconnect and the first trace interconnect.

3. The package of claim 1,
wherein the second trace interconnect is parallel and adjacent to the first trace interconnect, and
wherein a minimum spacing between the second trace interconnect and the first via interconnect is within plus or minus 10% of 25 micrometers.

4. The package of claim 1,
wherein the second trace interconnect is parallel and adjacent to the first trace interconnect, and
wherein a spacing between the second trace interconnect and the first via interconnect is less than 45 micrometers.

5. The package of claim 1, wherein the first trace interconnect and the first via interconnect are located in an escape portion of the substrate.

6. The package of claim 1, wherein the first trace interconnect is coupled to less than a top surface of the first via interconnect.

7. The package of claim 1, wherein the substrate includes a core layer.

8. An apparatus comprising:
a substrate comprising:
  a plurality of interconnects comprising:
    a first via interconnect with a first width;
    a first trace interconnect directly coupled to a side portion of the first via interconnect; and
    a second trace interconnect directly coupled to a first surface of the first via interconnect;
  wherein the first trace interconnect includes a second width that is less than the first width and the second trace interconnect includes a third width that is less than the first width; and
  at least one dielectric layer at least partially surrounding the plurality of interconnects; and
an integrated device coupled to the substrate, wherein the at least one dielectric layer and the plurality of interconnects are located in planes underneath the integrated device.

9. The apparatus of claim 8, wherein the first via interconnect is coupled to the first trace interconnect without an intervening pad interconnect between the first via interconnect and the first trace interconnect.

10. The apparatus of claim 8,
wherein the second trace interconnect is parallel and adjacent to the first trace interconnect, and
wherein a minimum spacing between the second trace interconnect and the first via interconnect is about 25 micrometers.

11. The apparatus of claim 8,
wherein the second trace interconnect is parallel and adjacent to the first trace interconnect, and
wherein a spacing between the second trace interconnect and the first via interconnect is less than 45 micrometers.

12. The apparatus of claim 8, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

13. A method for fabricating a package, comprising:
providing a substrate that includes:
  forming a plurality of interconnects comprising:
    a first via interconnect with a first width;
    a first trace interconnect directly coupled to a side portion of the first via interconnect; and
    a second trace interconnect directly coupled to a first surface of the via interconnect,
  wherein the first trace interconnect includes a second width that is less than the first width and the second trace interconnect includes a third width that is less than the first width; and
  forming at least one dielectric layer at least partially surrounding the plurality of interconnects; and
providing an integrated device coupled to the substrate and located over the substrate, wherein the at least one dielectric layer and the plurality of interconnects are located in planes underneath the integrated device.

14. The method of claim 13, wherein the first via interconnect is coupled to the first trace interconnect without an intervening pad interconnect between the first via interconnect and the first trace interconnect.

* * * * *